(12) United States Patent
Yamauchi et al.

(10) Patent No.: US 10,297,475 B2
(45) Date of Patent: May 21, 2019

(54) FLATTENING METHOD AND FLATTENING APPARATUS

(71) Applicant: Ebara Corporation, Tokyo (JP)

(72) Inventors: Kazuto Yamauchi, Osaka (JP);
Yasuhisa Sano, Osaka (JP); Hideyuki Hara, Osaka (JP); Junji Murata, Osaka (JP); Keita Yagi, Tokyo (JP)

(73) Assignee: Ebara Corporation, Tokyo (JP)

( * ) Notice: Subject to any disclaimer, the term of this patent is extended or adjusted under 35 U.S.C. 154(b) by 327 days.

(21) Appl. No.: 14/249,606

(22) Filed: Apr. 10, 2014

(65) Prior Publication Data

US 2014/0231011 A1    Aug. 21, 2014

Related U.S. Application Data

(62) Division of application No. 12/285,737, filed on Oct. 14, 2008, now Pat. No. 8,734,661.

(30) Foreign Application Priority Data

Oct. 15, 2007  (JP) ................................ 2007-268134
Nov. 27, 2007  (JP) ................................ 2007-305607

(51) Int. Cl.
*H01L 21/67*       (2006.01)
*B24B 37/32*       (2012.01)
(Continued)

(52) U.S. Cl.
CPC ........ *H01L 21/67075* (2013.01); *B24B 37/32* (2013.01); *H01L 21/02019* (2013.01);
(Continued)

(58) Field of Classification Search
USPC ....................................... 156/345.12, 345.23
See application file for complete search history.

(56) References Cited

U.S. PATENT DOCUMENTS 3,669,774 A      6/1972  Dismukes
3,923,569 A  *  12/1975  Ono ...................... H01L 21/00
                                                            252/79.2
(Continued)

FOREIGN PATENT DOCUMENTS

JP        62-107964        5/1987
JP        64-27852         1/1989
(Continued)

OTHER PUBLICATIONS

Mori et al. (Journal of Crystal Growth vol. 275, Issues 1-2, Feb. 15, 2005, pp. 39-50).
(Continued)

*Primary Examiner* — Sylvia MacArthur
(74) *Attorney, Agent, or Firm* — Wenderoth, Lind & Ponack, L.L.P.

(57) ABSTRACT

A flattening method, by utilizing the advantages of the CARE method and making up for the disadvantages, can perform removal processing of a surface of a workpiece at a sufficient processing rate and can provide a processed surface having enhanced flatness without leaving damage in the processed surface. A flattening method comprises at least two surface removal steps and at least two cleaning steps, the final surface removal step being a catalyst-referred etching step comprising immersing a workpiece in a processing solution containing at least one of hydrohalic acid, hydrogen peroxide water and ozone water, and bringing a surface of a catalyst platen into contact with or close proximity to a surface to be processed of the workpiece to process the surface, said catalyst platen having in a surface a catalyst selected from the group consisting of platinum, gold, a ceramic solid catalyst, a transition metal, glass, and an acidic or basic solid catalyst.

8 Claims, 16 Drawing Sheets

(51) Int. Cl.
*H01L 21/02* (2006.01)
*H01L 21/306* (2006.01)
*H01L 21/768* (2006.01)
*H01L 21/321* (2006.01)
*B24B 37/11* (2012.01)
*H01L 29/16* (2006.01)

(52) U.S. Cl.
CPC .. *H01L 21/30612* (2013.01); *H01L 21/67207* (2013.01); *H01L 21/67219* (2013.01); *B24B 37/11* (2013.01); *H01L 21/30625* (2013.01); *H01L 21/3212* (2013.01); *H01L 21/32115* (2013.01); *H01L 21/7684* (2013.01); *H01L 29/1608* (2013.01)

(56) References Cited

U.S. PATENT DOCUMENTS

| | | | |
|---|---|---|---|
| 5,537,508 A | 7/1996 | Ebbing et al. | |
| 5,744,857 A * | 4/1998 | Yamamoto | H01L 33/60 257/622 |
| 6,027,987 A | 2/2000 | Yamazaki et al. | |
| 6,030,425 A | 2/2000 | Hata | |
| 6,139,716 A | 10/2000 | McCarthy et al. | |
| 6,383,065 B1 | 5/2002 | Grumbine et al. | |
| 6,420,092 B1 | 7/2002 | Yang et al. | |
| 6,683,007 B1 * | 1/2004 | Yamasaki | B08B 3/02 257/E21.219 |
| 7,094,692 B2 | 8/2006 | Horibe et al. | |
| 8,332,064 B2 * | 12/2012 | Torikoshi | B24B 37/042 451/289 |
| 2001/0023986 A1 | 9/2001 | Mancevski | |
| 2001/0036747 A1 | 11/2001 | Solanky et al. | |
| 2002/0167025 A1 | 11/2002 | Nagao et al. | |
| 2004/0123951 A1 * | 7/2004 | Kramer | B24B 37/32 156/345.12 |
| 2004/0132381 A1 | 7/2004 | Basol et al. | |
| 2004/0185323 A1 | 9/2004 | Fowler et al. | |
| 2004/0259300 A1 | 12/2004 | Futase et al. | |
| 2004/0261944 A1 * | 12/2004 | Wakabayashi | B24B 37/345 156/345.12 |
| 2005/0151456 A1 | 7/2005 | Yoon et al. | |
| 2005/0224779 A1 | 10/2005 | Wang et al. | |
| 2005/0282347 A1 * | 12/2005 | Davies | H01L 21/764 438/329 |
| 2006/0254928 A1 | 11/2006 | Ein-Eli et al. | |
| 2006/0281196 A1 | 12/2006 | Feeney et al. | |
| 2008/0200100 A1 * | 8/2008 | Takahashi | B24B 9/065 451/44 |
| 2009/0028672 A1 * | 1/2009 | Yamawaku | H01L 21/67766 414/217 |
| 2009/0095712 A1 * | 4/2009 | Yamauchi | H01L 21/02019 216/53 |
| 2010/0147463 A1 * | 6/2010 | Yamauchi | C23C 8/40 156/345.12 |
| 2014/0231011 A1 * | 8/2014 | Yamauchi | H01L 21/02019 156/345.14 |

FOREIGN PATENT DOCUMENTS

| | | |
|---|---|---|
| JP | 1-236939 | 9/1989 |
| JP | 2962583 | 8/1999 |
| JP | 3069271 | 5/2000 |
| JP | 2000-167770 | 6/2000 |
| JP | 2002-299294 | 10/2002 |
| JP | 2004-55615 | 2/2004 |
| JP | 2004-153086 | 5/2004 |
| JP | 2004-319609 | 11/2004 |
| JP | 2004-327561 | 11/2004 |
| JP | 3734722 | 10/2005 |
| JP | 2006-114632 | 4/2006 |
| JP | 2006-121111 | 5/2006 |
| JP | 2007-189081 | 7/2007 |
| JP | 2007-253244 | 10/2007 |
| JP | 2008-71857 | 3/2008 |
| JP | 2008-121099 | 5/2008 |
| JP | 2008-136983 | 6/2008 |
| WO | 2007/007683 | 1/2007 |

OTHER PUBLICATIONS

Choi et al. (Radiation Physics and Chemistry vol. 57, Issue 2, Feb. 2000, pp. 179-186).
Hara et al. (Novel Abrasive-free Planarization of SiC using Catalyst, The 11th International Conference on Precision Engineering (ICPE) Aug. 16-18, 2006, Tokyo, Japan, pp. 267-270).
The 11th International Conference on Precision Engineering (ICPE) Aug. 16-18, 2006, Tokyo, Japan, Table of content, 10 pages.

* cited by examiner

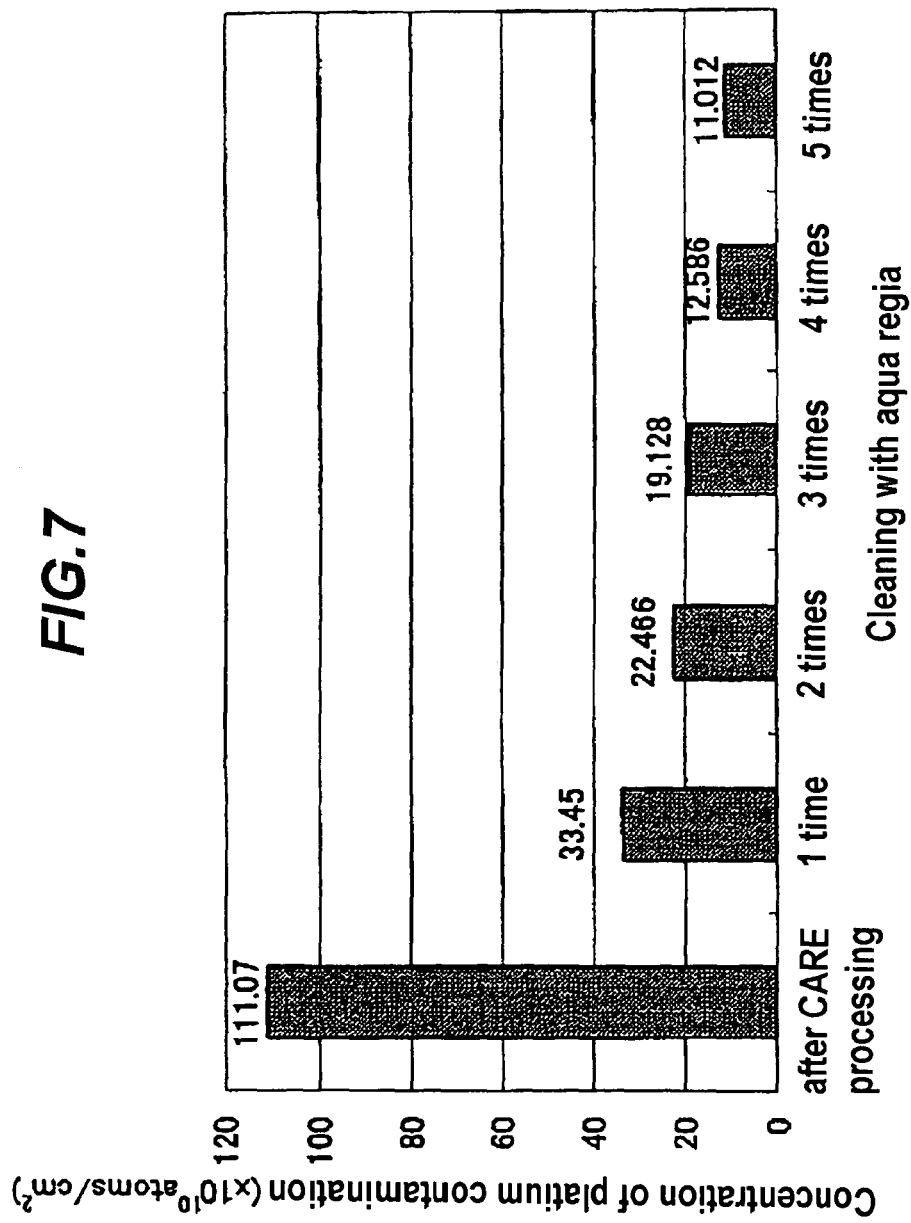

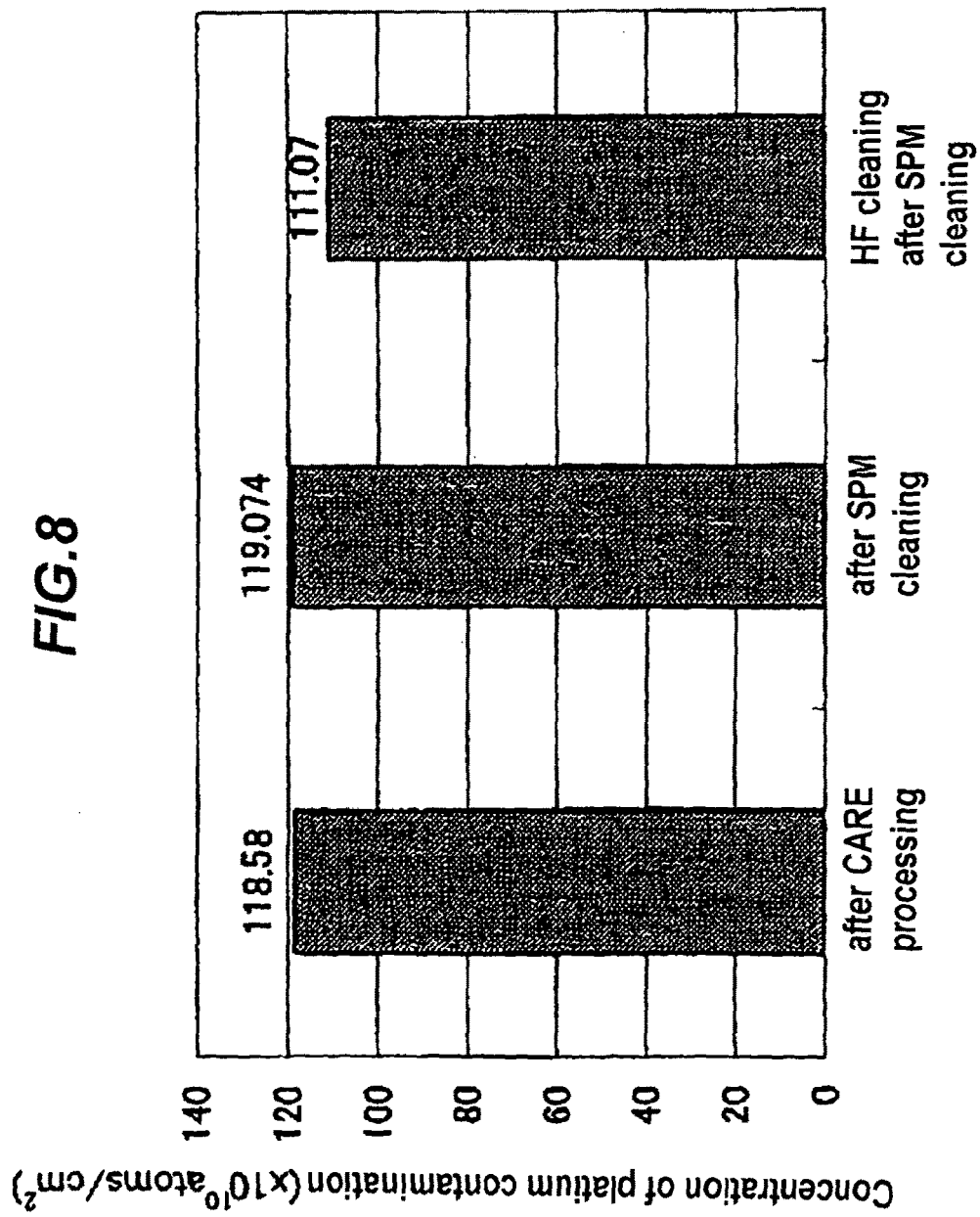

(PV:360nm, rms:5.69nm, Ra:4.24nm)

(P-V:23.9nm, rms:3.11nm, Ra:2.51nm)

(P-V:4.97nm, rms:0.84nm, Ra:0.68nm)

FLATTENING METHOD AND FLATTENING APPARATUS

The present application is a divisional application of U.S. patent application Ser. No. 12/285,737, filed Oct. 14, 2008, the entirety of which incorporated by reference. Application Ser. No. 12/285,737 was published as U.S. Pre-grant Publication Number 2009/0095712 on Apr. 16, 2009, and entirety of this publication is hereby incorporated by reference.

BACKGROUND OF THE INVENTION

Field of the Invention

The present invention relates to a flattening method and a flattening apparatus, and more particularly to a flattening method and a flattening apparatus for flatly processing a surface (surface to be processed) of a workpiece, such as a simple substrate consisting of SiC or GaN, a bonded substrate (epitaxial substrate) having a layer of SiC or GaN, or a substrate for use in MEMS (micro electro mechanical system).

Description of the Related Art

With the recent progress toward higher integration of semiconductor devices, the circuit interconnects are becoming finer and the distance between adjacent interconnects is becoming smaller. Especially when forming a circuit pattern by optical lithography with a line width of not more than 0.5 µm, a stepper requires a high flatness of imaging surface because of the small depth of focus. A CMP apparatus for carrying out chemical mechanical polishing (CMP) is known as a means for flattening a surface of such a semiconductor substrate.

SiC, GaN, etc. are becoming increasingly important as a material for semiconductor devices. As a new processing method for flatly processing with high precision a surface of SiC or GaN, a CARE (catalyst-referred etching) method has been proposed which utilizes a catalytic action, capable of a chemical reaction, to etch a surface of a workpiece. The CARE method comprises immersing a workpiece in a processing solution containing hydrohalic acid, such as hydrofluoric acid; placing a platinum, gold or ceramic solid catalyst in contact with or close proximity to a surface (surface to be processed) of the workpiece so as to cause molecular dissociation of hydrogen halide at the surface of the catalyst, thereby generating a halogen radical; and dissolving a halogen compound, which has been produced by chemical reaction between the halogen radical and a surface atom of the workpiece, in the processing solution. The surface of the workpiece is processed (etched) in this manner (see e.g., Japanese Patent Laid-Open Publication No. 2006-114632).

BRIEF SUMMARY OF THE INVENTION

The CARE method, which carries out removal processing (etching) of a surface of a workpiece, e.g., composed of SiC or GaN, has the advantageous features that it can process a surface (surface to be processed) of a workpiece with higher precision as compared to conventional processing methods such as CMP and can obtain a processed surface having high flatness and, in addition, can process the workpiece without leaving damage in the processed surface. However, the CARE method, in which removal processing (etching) of a surface of a workpiece progresses through dissolution in a processing solution of a halogen compound produced by chemical reaction between a halogen radical and a surface atom of the workpiece, has the drawback that the processing rate is significantly low as compared to grinding, CMP, etc. which are commonly used in the manufacturing of a semiconductor device. Thus, high-throughput processing is difficult with the CARE method.

The present invention has been made in view of the above situation in the related art. It is therefore an object of the present invention to provide a flattening method and a flattening apparatus which, by utilizing the advantages of the CARE method and making up for the disadvantages, can perform removal processing of a surface of a workpiece at a sufficient processing rate and can provide a processed surface having enhanced flatness without leaving damage in the processed surface.

In order to achieve the object, the present invention provides a flattening method comprising at least two surface removal steps and at least two cleaning steps, the final surface removal step being a catalyst-referred etching step comprising immersing a workpiece in a processing solution containing at least one of hydrohalic acid, hydrogen peroxide water and ozone water, and bringing a surface of a catalyst platen into contact with or close proximity to a surface to be processed of the workpiece to process the surface to be processed, said catalyst platen having in a surface a catalyst selected from the group consisting of platinum, gold, a ceramic solid catalyst, a transition metal, glass, and an acidic or basic solid catalyst.

The "surface removal step" is the step of processing and removing a surface portion of a workpiece, such as a substrate, and the "cleaning step" is the step of removing particulate contaminants, organic contaminants, metal contaminants, etc. from the surface of the workpiece before or after the surface removal step. The cleaning step also includes the step of removing an oxide film remaining on the surface of the workpiece after the surface removal step.

According to this flattening method, after carrying out at least one surface removal step to enhance the flatness of a surface to be processed of a workpiece, CARE processing, which can flatly process the surface (surface to be processed) of the workpiece with high precision, is carried out in the final surface removal step. This makes it possible to process the workpiece at a sufficient processing rate while gradually enhancing the flatness of the surface to be processed and finally create a damage-free, very flat processed surface.

The processing solution may also contain a wetting improver for improving wetting of the catalyst platen. Nitric acid or ethanol may be used as the wetting improver.

When processing is carried out using hydrofluoric acid as a processing solution and platinum as a catalyst, because of poor wetting of a surface of platinum with hydrofluoric acid, it is difficult to efficiently supply the processing solution (hydrofluoric acid) to the catalyst surface which serves as a processing reference surface. In such a case, efficient supply of the hydrofluoric acid processing solution to the catalyst surface becomes possible by adding a wetting improver to the processing solution. Preferable examples of the wetting improver include nitric acid and ethanol.

The processing solution may also contain a buffering agent for pH adjustment.

The processing solution may also contain an organic alcohol or an inorganic acid. Methanol or ethanol may be used as the organic alcohol, and sulfuric acid or nitric acid may be used as the inorganic acid.

The processing solution may also contain a buffering agent.

A buffering agent is a solution which prevents a change in the pH of the processing solution even when a small amount of an acid or base is added to the processing solution. Especially when processing GaN, because of the formation of its oxide $Ga_2O_3$ which is soluble in an acid or a base, it is necessary to keep the processing solution at a pH around 7 so as to prevent dissolution of $Ga_2O_3$ in the processing solution. The pH of the processing solution can be adjusted by adding a pH-adjusted buffering agent to the processing solution. Further, a buffering agent has the property of consuming $H^+$ ions or $OH^+$ ions generated, and therefore can shorten the active distance of $H^+$ ions or $OH^+$ ions in the vicinity of an acidic or basic solid catalyst. Thus, the use of a buffering agent can cause $H^+$ ions or $OH^+$ ions to be present only in close proximity to a solid catalyst, making it possible to more flatly process a workpiece.

The present invention also provides a flattening method comprising at least two surface removal steps and at least two cleaning steps, the final surface removal step being a catalyst-referred etching step comprising immersing a workpiece in a processing solution containing a buffering agent, and bringing a surface of a catalyst platen into contact with or close proximity to a surface to be processed of the workpiece to process the surface to be processed, said catalyst platen having in the surface a catalyst selected from the group consisting of platinum, gold, a ceramic solid catalyst, a transition metal, glass, and an acidic or basic solid catalyst.

At least one of the surface removal steps other than the final surface removal step may be grinding, lapping, CMP or light irradiation catalyst-referred etching of the surface to be processed of the workpiece, the light irradiation catalyst-referred etching corresponding to said catalyst-referred etching step as carried out under light irradiation.

For example, it is possible to first carry out a surface removal step by grinding or lapping which, though the processing accuracy is not so high, can be carried out at a relatively high processing rate, and also carry out, according to necessity, CMP or light irradiation catalyst-referred etching, i.e., catalyst-referred etching carried out under light irradiation, and lastly carry out the catalyst-referred etching step as the final surface removal step. This flattening process can flatten a surface to be processed, having relatively large initial irregularities, of a workpiece into a processed surface having a desired flatness in a shorter time. The grinding may be carried out by, for example, electrolytic in-process dressing (ELID) mirror grinding.

CMP or light irradiation catalyst-referred etching, i.e., catalyst-referred etching carried out under light irradiation, though inferior to catalyst-referred etching in terms of the flatness of a processed surface, can perform surface removal processing at a higher processing rate as compared to catalyst-referred etching. Accordingly, by carrying out catalyst-referred etching after carrying out CMP or light irradiation catalyst-referred etching, the overall processing rate can be increased.

At least one of the cleaning steps may be SPM (sulfuric acid-hydrogen peroxide mixture) cleaning, aqua regia cleaning or hydrofluoric acid cleaning.

A surface to be processed of a workpiece can be cleaned by aqua regia cleaning when the surface to be processed is contaminated with platinum, by SPM cleaning when the surface to be processed is contaminated with organic matter or with a metal other than noble metals, or by hydrofluoric acid cleaning when an oxide film is formed in the surface to be processed.

At least one of the cleaning steps may be rinsing of the workpiece in a cleaning unit.

At least one of the cleaning steps may be rinsing of the workpiece carried out around the catalyst platen.

The present invention also provides a flattening apparatus comprising at least two surface removal processing units and at least two cleaning units, the surface removal processing unit for carrying out the final surface removal processing being a catalyst-referred etching unit comprising: a catalyst platen having in a surface a catalyst selected from the group consisting of platinum, gold, a ceramic solid catalyst, a transition metal, glass, and an acidic or basic solid catalyst; a holder for holding a workpiece and bringing a surface to be processed of the workpiece into contact with or close proximity to the surface of the catalyst platen; a processing solution supply section for supplying a processing solution, containing at least one of hydrohalic acid, hydrogen peroxide water and ozone water, to between the catalyst platen and the workpiece held by the holder and kept in contact with or close proximity to the surface of the catalyst platen; and a drive section for moving the catalyst platen and the workpiece, held by the holder and kept in contact with or close proximity to the surface of the catalyst platen, relative to each other.

The present invention also provides a flattening apparatus comprising at least two surface removal processing units and at least two cleaning units, the surface removal processing unit for carrying out the final surface removal processing being a catalyst-referred etching unit comprising: a catalyst platen having in a surface a catalyst selected from the group consisting of platinum, gold, a ceramic solid catalyst, a transition metal, glass, and an acidic or basic solid catalyst; a holder for holding a workpiece and bringing a surface to be processed of the workpiece into contact with or close proximity to the surface of the catalyst platen; a processing solution supply section for supplying a processing solution containing a buffering agent to between the catalyst platen and the workpiece held by the holder and kept in contact with or close proximity to the surface of the catalyst platen; and a drive section for moving the catalyst platen and the workpiece, held by the holder and kept in contact with or close proximity to the surface of the catalyst platen, relative to each other.

Preferably, a plurality of through-holes is formed in the catalyst platen.

A processing solution can be uniformly supplied through the through-holes to the surface of the catalyst platen, whereby an entire surface to be processed of a workpiece can be processed more uniformly.

Preferably, a plurality of concentric grooves is formed in the surface of the catalyst platen.

A processing solution can be held in the grooves provided in the surface of the catalyst platen, thus allowing the processing solution to be present between a workpiece and the catalyst platen.

The holder preferably has a retainer ring, made of the same material as the surface of the catalyst platen, for preventing escape of the workpiece.

When the holder having the retainer ring is used, there is a case where the retainer ring contacts the catalyst platen and is chipped off, and the retainer ring chip adheres to the surface of the catalyst platen. Even in such a case, the retainer ring chip, because of the same material as the surface of the catalyst platen, will not adversely affect the removal processing reaction.

In a preferred aspect of the present invention, the flattening apparatus further comprises a conditioning section for carrying out conditioning of the surface of the catalyst platen.

Specific examples of the conditioning section include: a pure water jet nozzle for jetting pure water toward the catalyst platen while causing cavitation or applying ultrasonic waves as necessary; alight irradiator for applying light to the catalyst platen to remove a broken piece or an organic contaminant from the surface of the catalyst platen by photoelectrochemical etching; and an electrolytic removal apparatus which includes an electrode disposed opposite the catalyst platen and removes a broken piece or an organic contaminant from the surface of the catalyst platen by applying a voltage between the catalyst platen and the electrode. A broken piece which has been separated from the catalyst platen can be removed, e.g., by filtration.

At least one of the surface removal processing units other than the surface removal processing unit for carrying out the final surface removal processing may be a grinding unit, a lapping unit, a CMP unit, or a light irradiation catalyst-referred etching unit having the same construction as said catalyst-referred etching unit but additionally comprising a light source.

According to the present invention, after carrying out at least one surface removal step to enhance the flatness of a surface to be processed of a workpiece, CARE (catalyst-referred etching) processing, which can flatly process the surface (surface to be processed) of the workpiece with high precision, is carried out in the final surface removal step. This makes it possible to process the workpiece at a sufficient processing rate while gradually enhancing the flatness of the surface to be processed and finally create a damage-free, very flat processed surface. The present invention thus makes it possible to increase the throughput while fully enjoying the merits of CARE.

BRIEF DESCRIPTION OF THE DRAWINGS

FIG. 7 is a graph showing the results of total reflection X-ray fluorescence analysis of platinum contamination as measured on a sample after CARE processing and on the processed sample after cleaning with aqua regia;

FIG. 8 is a graph showing the results of total reflection X-ray fluorescence analysis of platinum contamination as measured on a sample after CARE processing, on the processed sample after cleaning with SPA and on the processed sample after additional cleaning with hydrofluoric acid (HF);

DETAILED DESCRIPTION OF THE INVENTION

Preferred embodiments of the present invention will now be described with reference to the drawings. The following description illustrates the case of using hydrofluoric acid (HF) as a processing solution and platinum as a catalyst, and processing and removing a surface (surface to be processed) of a substrate, such as an SiC wafer, into a desired flatness.

Figure 1:
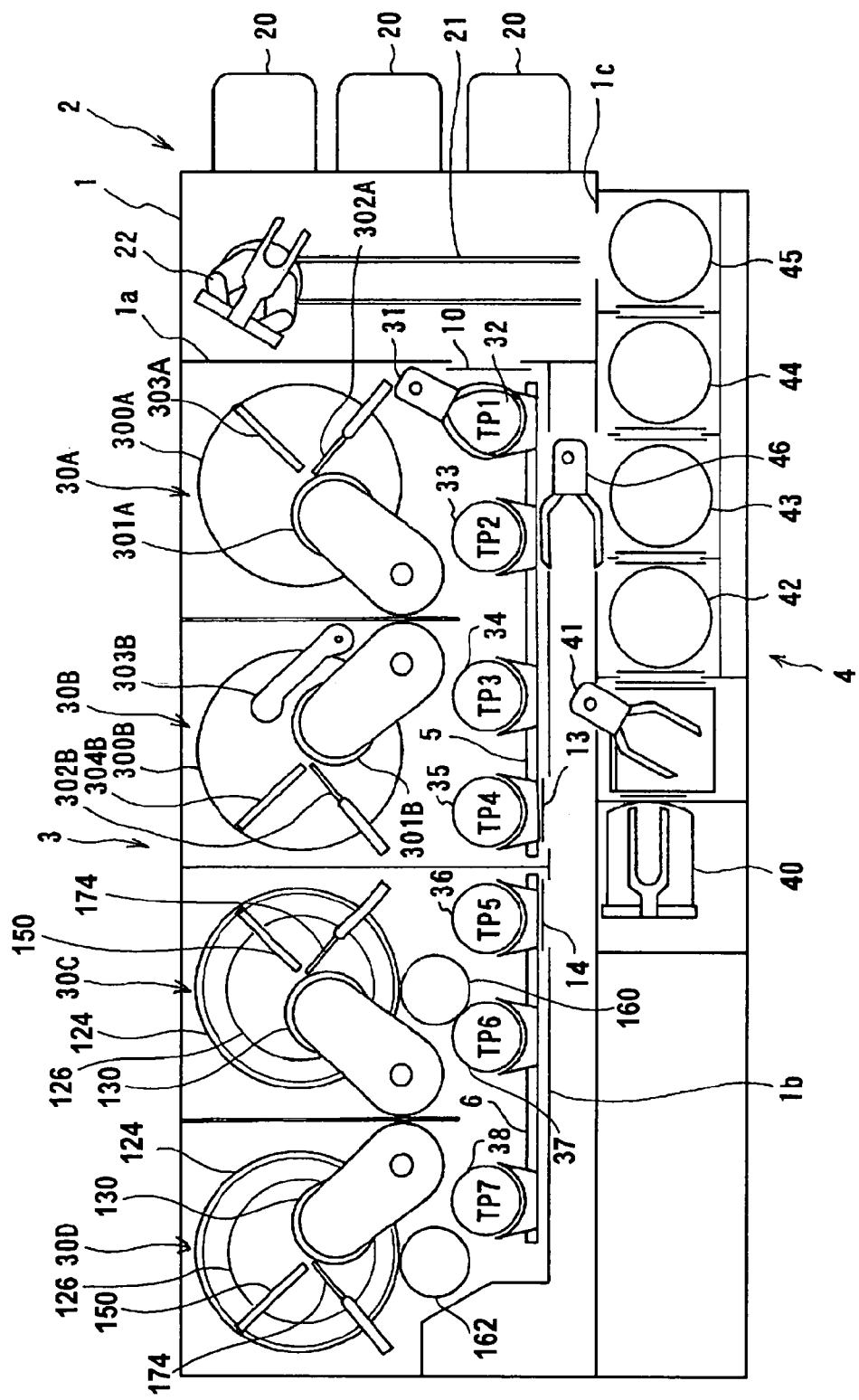
FIG. 1 is a plan view showing the overall construction of a flattening apparatus according to an embodiment of the present invention.

FIG. 1 is a plan view showing the overall construction of a flattening apparatus according to an embodiment of the present invention. As shown in FIG. 1, the flattening apparatus of this embodiment includes a generally rectangular housing 1 whose interior is divided by partition walls 1a, 1b, 1c into a loading/unloading section 2, a surface removal processing section 3 and a cleaning section 4. The loading/unloading section 2, the surface removal processing section 3 and the cleaning section 4 are independently fabricated and independently ventilated.

The loading/unloading section 2 includes at least two (three in this embodiment) front loading sections 20 each for placing a substrate cassette storing substrates (workpieces). The front loading sections 20 are arranged side by side in the width direction (perpendicular to the long direction) of the flattening apparatus. Each front loading section 20 can place an open cassette, a SMIF (standard manufacturing interface) pod or a FOUP (front opening unified pod). The SMIF and FOUP are closed containers which can house a substrate cassette and can keep an interior environment independent of the exterior environment.

A traveling mechanism 21, extending along the line of the front loading sections 20, is provided in the loading/unloading section 2. On the traveling mechanism 21 is provided a first transport robot 22 as a first transport mechanism, which is movable along the direction in which substrate cassettes are arranged. The first transport robot 22 can reach the substrate cassettes placed in the front loading sections 20 by moving on the traveling mechanism 21. The first transport robot 22 has two hands, an upper hand and a lower hand, and can use the two hands differently, for example, by using the upper hand when returning a processed substrate to a substrate cassette and using the lower hand when transporting an unprocessed substrate.

The loading/unloading section 2 is an area which needs to be kept in the cleanest environment. Accordingly, the interior of the loading/unloading section 2 is constantly kept at a higher pressure than any of the outside of the apparatus, the surface removal processing section 3 and the cleaning section 4. Furthermore, a filter-fan unit (not shown) having an air filter, such as an HEPA filter or a ULPA filter, is provided above the traveling mechanism 21 for the first transport robot 22. Clean air, from which particles, vapor and gas have been removed, continually blows off downwardly through the filter-fan unit.

The surface removal processing section 3 is an area where removal processing of a surface (surface to be processed) of a substrate is carried out and, in this embodiment, includes therein a lapping unit 30A as a first surface removal processing unit, a CMP unit 30B as a second surface removal processing unit and two catalyst-referred etching (CARE) units 30C, 30D as third (final) surface removal processing units. As shown in FIG. 1, the lapping unit 30A, the CMP unit 30B and the CARE units 30C, 30D are arranged along the long direction of the flattening apparatus.

The lapping unit 30A includes a platen 300A having a lapping surface, a top ring 301A for detachably holding a substrate and pressing the substrate against the platen 300A, a lapping liquid supply nozzle 302A for supplying a lapping liquid, such as a diamond slurry or a colloidal silica slurry, to the platen 300A, and a pure water supply nozzle 303A for supplying pure water to the surface of the platen 300A. During lapping in the lapping unit 30A, the lapping liquid (slurry) is supplied from the lapping liquid supply nozzle 302A onto the platen 300A, and a substrate as a workpiece is held by the top ring 301A and pressed against the platen 300A to carry out lapping of the surface of the substrate.

The lapping unit (first surface removal processing unit) 30A is mainly directed to obtaining a large processing amount while enhancing the flatness of a substrate surface in the process of flattening, e.g., a substrate surface having relatively large initial irregularities into a desired flatness. The lapping unit 30A can therefore be omitted when a surface to be processed of a substrate does not have large initial irregularities. Though in this embodiment the lapping unit 30A is used as a first surface removal processing unit, it is also possible to use, instead of the lapping unit 30A, a grinding unit, such as an electrolytic in-process dressing (ELID) mirror grinding unit, which can obtain a considerably larger processing amount than the CARE units 30C, 30D.

The CMP unit (second surface removal processing unit) 30B includes a polishing table 300B having a polishing surface, a top ring 301B for detachably holding a substrate and pressing the substrate against the polishing table 300B to polish the substrate, a polishing liquid supply nozzle 302B for supplying a polishing liquid or a dressing liquid (e.g., water) to the polishing table 300B, a dresser 303B for carrying out dressing of the polishing surface of the polishing table 300B, and an atomizer 304B for spraying a mixed fluid of a liquid (e.g., pure water) and a gas (e.g., nitrogen gas) in a mist form onto the polishing surface of the polishing table 300B from one or a plurality of nozzles.

A polishing cloth, abrasive grains (fixed abrasive grains), or the like, constituting a polishing surface for polishing a substrate surface, is attached to the upper surface of the polishing table 300B of the CMP unit 30B. During polishing in the polishing unit 30B, a polishing liquid is supplied from the polishing liquid supply nozzle 302B onto the polishing surface of the polishing table 300B, and a substrate as a workpiece is held by the top ring 301B and pressed against the polishing surface to carry out polishing of the surface of the substrate.

The CMP unit (second surface removal unit) 30B is to enhance the flatness of a substrate surface while processing the substrate at a higher processing rate, i.e., obtaining a larger processing amount, than the CARE units 30C, 30D. Thus, the CMP unit 30B, when used in combination with the above-described lapping unit (first surface removal processing unit) 30A, can effectively flatten a substrate surface having relatively large initial irregularities into a desired flatness. Depending on the degree of surface irregularities of the substrate to be processed, etc., however, the use of the CMP unit 30B may be omitted.

Figure 2:
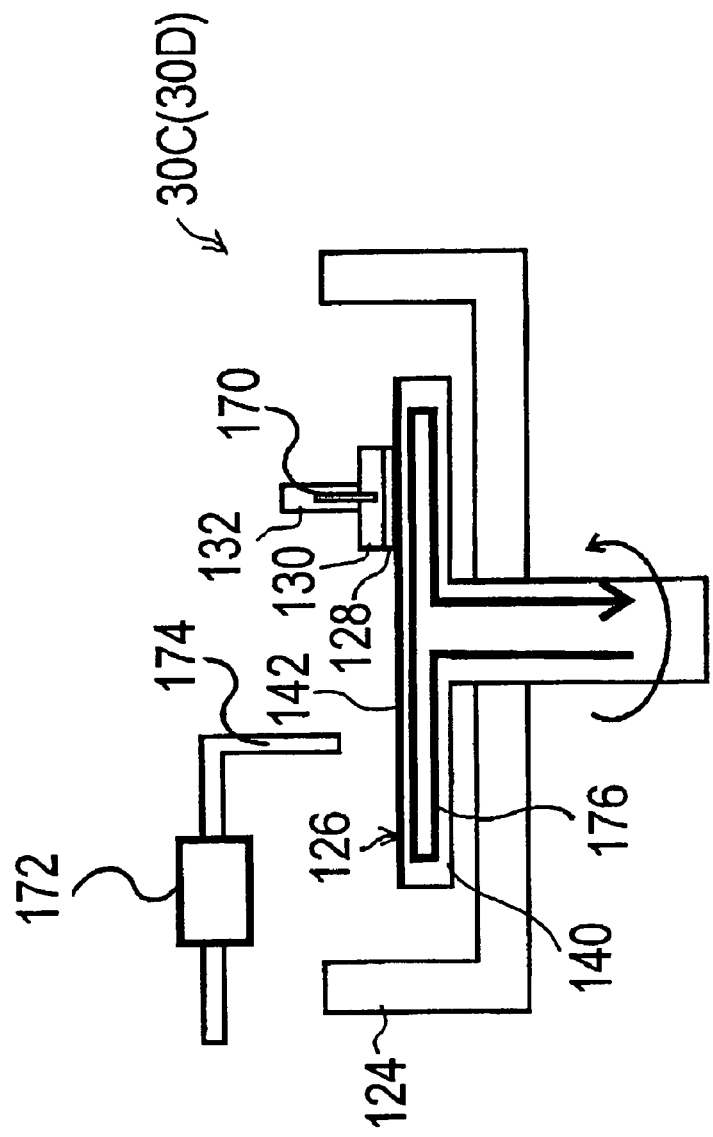
FIG. 2 is a vertical sectional front view schematically showing a CARE unit used as a final surface removal processing unit in the flattening apparatus of FIG. 1.
Figure 3:
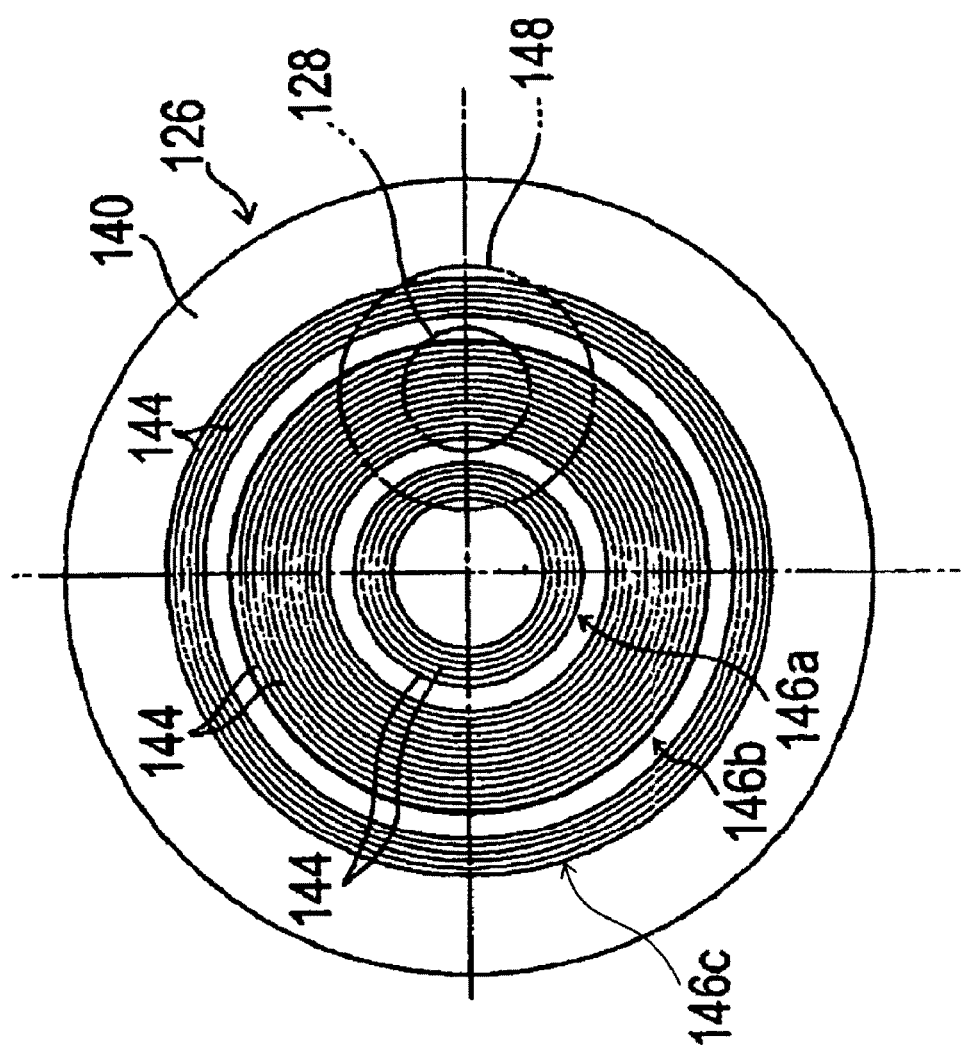
FIG. 3 is a plan view of a catalyst platen for use in the CARE unit of FIG. 2.
Figure 4:
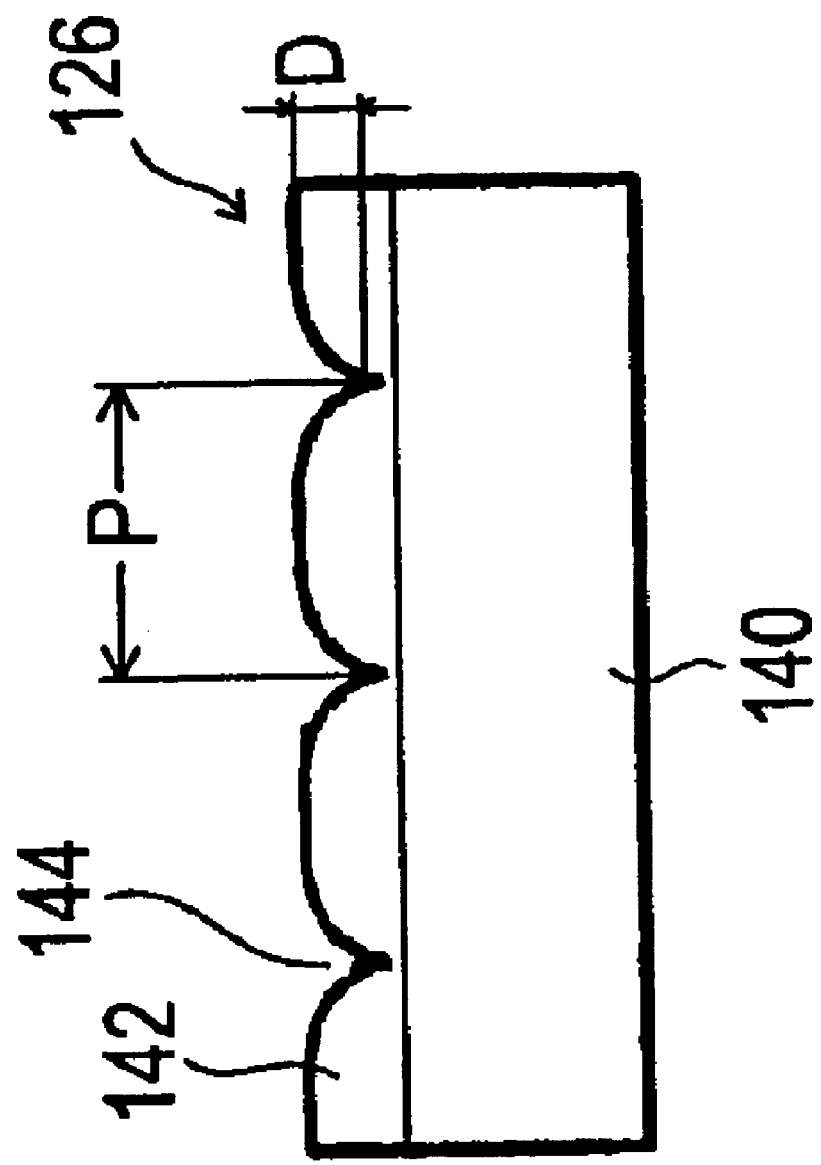
FIG. 4 is an enlarged view of a portion of FIG. 3.

Though in this embodiment the CMP unit 30B is used as a second surface removal processing unit, it is also possible to use, instead of the CMP unit 30B, a light irradiation catalyst-referred etching unit (light irradiation CARE unit) which has the same construction as the CARE unit 30C or 30D shown in FIGS. 2 through 4 but additionally includes a light source for applying light, preferably ultraviolet light, to a surface of a substrate held by a substrate holder and which, upon removal processing of a substrate surface, applies light to the substrate surface to activate it, so that the substrate surface can be processed at a higher processing rate than the CARE unit. It is also possible to use the light irradiation catalyst-referred etching unit (light irradiation CARE unit) shown in FIG. 13.

As shown in detail in FIG. 2, the CARE units (third surface removal processing units) 30C, 30D each include a processing tank 124, a catalyst platen 126 rotatably disposed in the processing tank 124, and a substrate holder 130 for detachably holding a substrate (workpiece) 128 with its surface (surface to be processed) facing downwardly. The substrate holder 130 is made of, e.g., SiC which has excellent processability, chemical resistance and temperature resistance. It is also possible to use rigid PVC (polyvinyl chloride) or PEEK (polyether ether ketone) for the substrate holder 130. The substrate holder 130 is coupled to the front end of a vertically-movable rotating shaft 132 which is disposed parallel to and eccentrically with respect to the axis of rotation of the catalyst platen 126. The substrate holder 130 is supported (by a ball bearing) pivotably with respect to the rotating shaft 132, so that the substrate holding surface of the substrate holder 130 can follow the surface of the catalyst platen 126 and the workpiece 128 can make plane contact with the catalyst platen 126.

In this embodiment, surface removal processing of the substrate 128, such as an SiC wafer, in the CARE units 30C, 30D is carried out by using, e.g., hydrofluoric acid (50% HF) as a processing solution and using the catalyst platen 126, e.g., composed of a 28 mm-thick molybdenum substrate 140 and a 1 mm-thick platinum sheet 142 as a catalyst attached to the substrate 140. It is also possible to use a molybdenum or molybdenum alloy plate as the catalyst platen 126, without providing a platinum sheet as a catalyst, and use the molybdenum or molybdenum alloy plate as a catalyst. Further, hydrohalic acid other than hydrofluoric acid, such as hydrochloric acid, may also be used as a processing solution.

The processing solution used preferably contains as an additive a wetting improver for improving wetting of the surface of the catalyst platen. The wetting improver is a compound having a hydrophilic group and a hydrophobic group in the molecule and, when added to the processing solution, can improve wetting of the catalyst platen with the processing solution. This can increase the efficiency of supply of the processing solution to between a substrate (workpiece) and the catalyst platen, enabling stable surface removal processing.

The processing solution may also contain as an additive a buffering agent for pH adjustment. By adjusting the pH of the processing solution with a buffering agent, a substrate (workpiece), in its area other than the removal processing reaction area, can be prevented from dissolving in the processing solution. Further, $H^+$ ions or $OH^-$ ions, which are active species generated at the surface of the catalyst platen, can be quickly deactivated, thereby limiting the removal processing reaction to the close vicinity of the surface of the catalyst platen. This can enhance a flatness of a processed surface of a substrate (workpiece).

The processing solution may also contain an organic alcohol, such as methanol or ethanol, or an inorganic acid, such as sulfuric acid or nitric acid. F atoms or OH radicals generated at the surface of the catalyst platen are very active, and have a very short life, i.e., promptly lose their activity. There is therefore a case where a sufficient processing rate cannot be obtained. In such a case, by adding an alcohol such as ethanol or an inorganic acid such as nitric acid to the processing solution to cause the additive to react with F atoms or OH radicals, it becomes possible to secondarily generate organic radicals or nitrate radicals which have a longer life than F atoms or OH radicals, thereby increasing the processing rate.

The above-described additives (wetting improver, pH adjuster, organic alcohol, inorganic acid) may be used either singly or in a combination of two or more.

Further, the processing solution may also contain a buffering agent (buffer solution) capable of preventing a change in the pH of the processing solution.

A heater 170, embedded in the substrate holder 130 and extending into the rotating shaft 132, is provided as a temperature control mechanism for controlling the temperature of the substrate 128 held by the substrate holder 130. Above the processing tank 124 is disposed a processing solution supply nozzle 174 for supplying the processing solution (hydrofluoric acid), which is controlled at a predetermined temperature by a heat exchanger 172 as a temperature control mechanism, into the processing tank 124. Furthermore, a fluid passage 176 as a temperature control mechanism for controlling the temperature of the catalyst platen 126 is provided in the interior of the catalyst platen 126.

Though the heater 170 as a temperature control mechanism for controlling the temperature of the substrate 128, the heat exchanger 172 as a temperature control mechanism for controlling the temperature of the processing solution, and the fluid passage 176 as a temperature control mechanism for controlling the temperature of the catalyst platen 126 are used in this embodiment, it is possible to omit all of the temperature control mechanisms or to employ any one of them.

As is known by the Arrhenius equation, with reference to a chemical reaction, the higher the reaction temperature, the higher is the reaction rate. Thus, by controlling at least one of the temperature of the workpiece 128, the temperature of the processing solution and the temperature of the catalyst platen 126 so as to control the reaction temperature, the processing rate can be adjusted or changed in such a manner as to stabilize the processing.

As shown in FIGS. 3 and 4, a plurality of concentric grooves 144 are formed over three groove formation areas 146a, 146b, 146c in the surface of the platinum (catalyst) layer 142 of the catalyst platen 126. In this embodiment, the width of the groove formation area 146b, lying in the middle of the three groove formation areas, is smaller than the diameter of the substrate 128 held by the substrate holder 130. This allows two ends of the substrate 128, held by substrate holder 130, to lie in the flat area between the groove formation areas 146a and 146b and in the flat area between the groove formation areas 146b and 146c, respectively, so that the ends of the substrate 128, held and being rotated by the substrate holder 130, will not be caught in a groove 144. When the use of a thin platinum (catalyst) layer 142 is intended, the depth of the grooves formed in the layer 142 should necessarily be small accordingly. When the width, the depth and the pitch of the grooves are made small, however, the fluidity of a fluid will become poor and a large attraction (adsorption) power will be generated between a substrate and the catalyst. It is therefore desirable that the depth D of the grooves be made as small as possible within the acceptable range of adsorption power.

As shown in phantom line in FIG. 3, when using a substrate holder provided with a retainer ring 148 surrounding the circumference of the substrate 128, the overall width of the groove formation areas 146a, 146b, 146c is made smaller than the diameter of the retainer ring 148 so that two ends of the rotating retainer ring 148 are allowed to lie in the flat areas outside the groove formation areas 146a, 146c and will not be caught in a groove 144. In this case, in order to prevent end portions, etc. of the substrate 128 from being caught in a groove 144, the grooves 144 have not a rectangular but an r-shaped cross-section, as shown in FIG. 4. The grooves may have any tapered cross-section.

The pitch (groove pitch) of the grooves 144 is preferably as small as possible in order to efficiently supply the processing solution to the area of contact (processing area) between the catalyst platen 126 and the substrate 128. In this embodiment, as shown in FIG. 4, the groove pitch P is set about 3 to 5 mm, and the groove depth D is set about 0.5 to 1.0 mm. To make the platinum catalyst layer 142 thin, the groove depth D is preferably made small to such an extent as not cause unacceptable attraction between the platinum layer 142 and the substrate 128. When the large number of concentric grooves 144 are provided in the surface of the platinum (catalyst) layer 142 of the catalyst platen 126 as in this embodiment, it is preferred to pivot the substrate 128 with the substrate holder 130 in order to enhance the uniformity of processing amount in the entire surface to be processed of the substrate 128. Instead of the concentric grooves, eccentric grooves or a spiral groove may also be employed.

When the processing solution (hydrofluoric acid) is supplied from the processing supply nozzle 174 to the catalyst platen 126, the processing solution is held in the grooves 144 provided in the surface of the catalyst platen 126. While pressing the substrate (workpiece) 128, held by the substrate holder 130, against the surface of the platinum (catalyst) layer 142 of the catalyst platen 126 at a predetermined pressure and allowing the processing solution to be present in the area of contact (processing area) between the substrate 128 and the platinum (catalyst) layer 142 of the catalyst platen 126, the catalyst platen 126 and the substrate 128 are rotated, thereby flatly processing (etching) the surface (lower surface) of the substrate 128 such as an SiC wafer. Instead of pressing the substrate 128, held by the substrate holder 130, against the platinum (catalyst) layer 142 of the catalyst platen 126 at a predetermined pressure, it is also possible to keep the substrate 128 in close proximity to the platinum (catalyst) layer 142 in carrying out removal processing (etching) of the surface of the substrate 128.

When using a substrate holder having the retainer ring 148 for preventing escape of a substrate, it is preferred that at least that portion of the retainer ring 148, which is to face the catalyst platen 126, be made of the same material as the surface material of the catalyst platen 126. For example, when platinum is used as the surface material (catalyst) of the catalyst platen 126, that portion of the retainer ring 148, which is to face or contact the catalyst platen 126, is preferably made of platinum. Similarly, when iron is used as the surface material of a catalyst platen, that portion of the retainer ring, which is to face or contact the catalyst platen, is preferably made of iron.

There is a case where the surface material of the retainer ring 148 contacts the catalyst platen 126 and is chipped off, and the retainer ring chip adheres to the surface of the catalyst platen 126. Even in such a case, if the surface material of the retainer ring is made of the same material as the surface material of the catalyst platen 126, processing can be continued without loss of the catalytic effect of the catalyst platen 126. The surface material of the retainer ring 148 may also be an alloy rich in the same metal as the surface metal of the catalyst platen 126. For example, when iron is used as the surface metal of the catalyst platen, the surface material of the retainer ring may be an iron-rich alloy, such as carbon steel or stainless steel.

Figure 5:
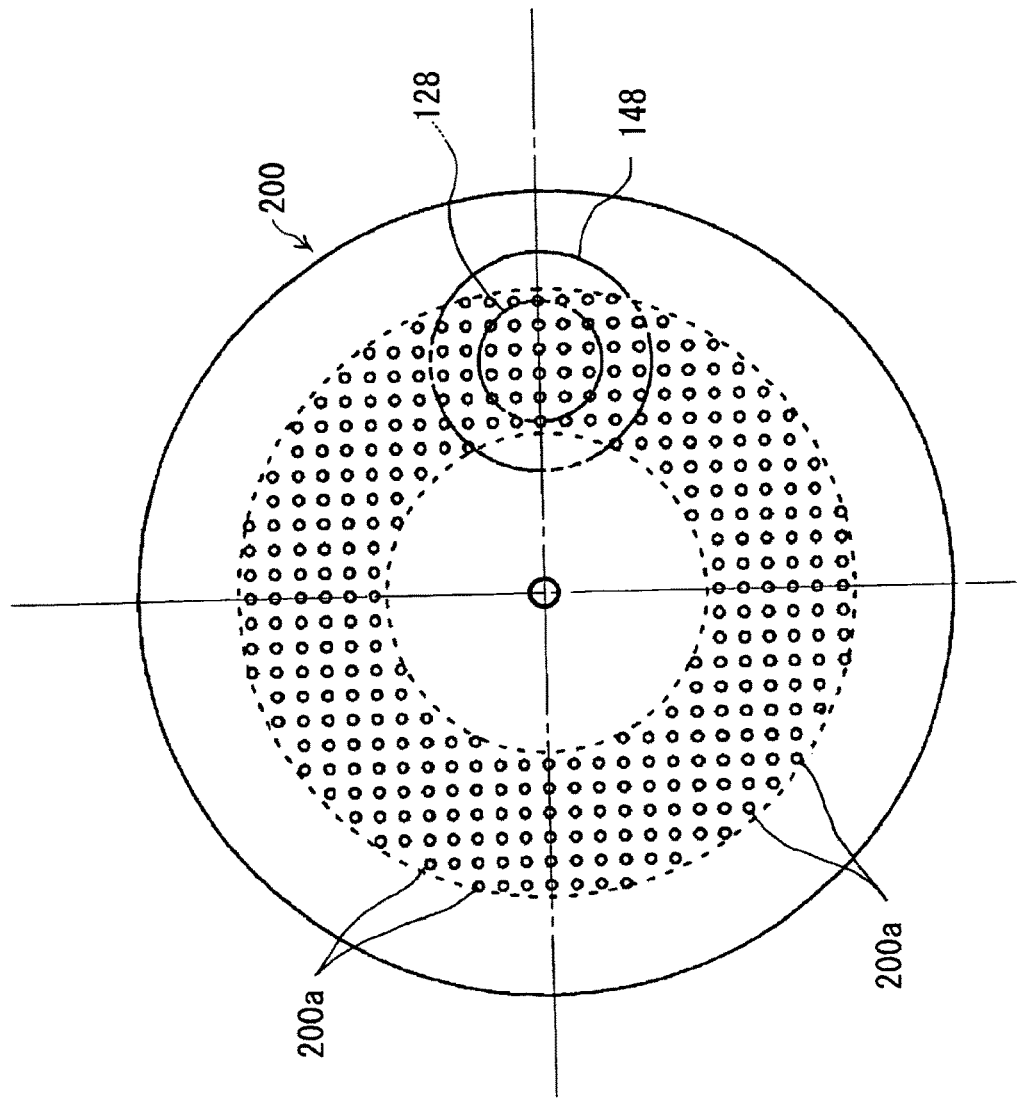
FIG. 5 is a plan view of another catalyst platen.
Figure 6:
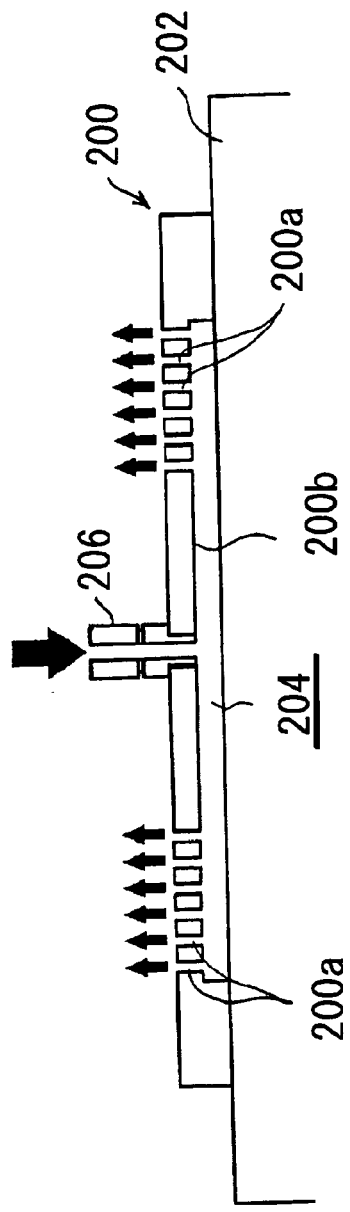
FIG. 6 is a cross-sectional view showing the catalyst platen shown in FIG. 5 as mounted to a rotating body.

It is also possible to use a catalyst platen 200 which, as shown in FIGS. 5 and 6, has a large number of through-holes 200a in its area which is to contact the substrate (workpiece) 128 held by the substrate holder 130 shown in FIG. 2. As with the above-described catalyst platen 126, the catalyst platen 200 may be composed of a molybdenum substrate and a platinum sheet as a catalyst attached to the substrate.

In this embodiment, the through-holes 200a are formed in equally-spaced lattice positions in the catalyst platen 200. The lattice spacing is, for example, 5 mm and the diameter of the through-holes 200a is, for example, 1 mm. The lattice spacing and the hole diameter of the through-holes 200a are preferably as small as possible. The provision of the uniformly distributed though-holes 200a in the catalyst platen 200 enables uniform processing of the entire surface of the substrate (workpiece) 128.

A recess 200b is formed in the lower surface of the catalyst platen 200 and, when the catalyst platen 200 is mounted on the upper surface of a rotating body 202, a processing solution reservoir 204 is formed between the catalyst platen 200 and the rotating body 202. The catalyst platen 200 has a vertical through-hole in the center, and a rotary joint 206 is mounted to the through-hole. The rotary joint 206 is connected to the processing solution supply nozzle 174 shown in FIG. 2, for example.

In this embodiment, processing of the substrate (workpiece) 128 is carried out in the following manner: While rotating the catalyst platen 200 together with the rotating body 202, the processing solution is supplied through the rotary joint 206 into the processing solution reservoir 204 between the catalyst platen 200 and the rotating body 202, and the processing solution is spouted from the through-holes 200a. This manner of processing can prevent the substrate (workpiece) 128 from sticking to the catalyst platen 200 and, at the same time, can replace the processing solution remaining in the through-holes 200a.

The pressure of the processing solution spouting from the through-holes 200a is preferably much lower than the pressure of the substrate (workpiece) 128 on the catalyst platen 200. In consideration of the strength of the catalyst platen, it is also possible to form radial grooves extending from the center of the catalyst platen so that the processing solution will be supplied through the grooves to below the through-holes.

As shown in FIG. 1, each of the CARE units 30C, 30D is provided with a pure water jet nozzle 150 as a conditioning section for carrying out conditioning of the surface of the catalyst platen 126 by jetting pure water toward the surface platinum (catalyst) layer 142 of the catalyst platen 126 while causing cavitation or applying ultrasonic waves, as necessary. It is also possible to use as a conditioning section a light irradiator for applying light to the catalyst platen to remove a broken piece or an organic contaminant from the surface of the catalyst platen by photoelectrochemical etching, or an electrolytic removal apparatus which includes an electrode disposed opposite the catalyst platen and electrolytically removes a broken piece or an organic contaminant from the surface of the catalyst platen by applying a voltage between the catalyst platen and the electrode. A broken piece, which has been separated from the catalyst platen 126, can be removed, e.g., by filtration.

Between the lapping unit 30A, the CMP unit 30B and the cleaning unit 4 is disposed a first linear transporter 5 as a second (translatory) transport mechanism for transporting a substrate between four transport positions (first transport position TP1, second transport position TP2, third transport position TP3 and fourth transport position TP4 in order of distance from the loading/unloading section 2) along the long direction of the apparatus. A reversing machine 31 for reversing a substrate received from the first transport robot 22 is disposed above the first transport position TP1 of the first linear transporter 5, and a vertically-movable lifter 32 is disposed below the reversing machine 31. Further, a vertically-movable pusher 33 is disposed below the second transport position TP2, a vertically-movable pusher 34 is disposed below the third transport position TP3, and a vertically-movable lifter 35 is disposed below the fourth transport position TP4.

Beside the CARE units 30C, 30D and adjacent to the first linear transporter 5 is disposed a second linear transporter 6 as a second (translatory) transport mechanism for transporting a substrate between three transport positions (fifth transport position TP5, sixth transport position TP6 and seventh transport position TP7 in order of distance from the loading/unloading section 2) along the long direction of the apparatus. A vertically-movable lifter 36 is disposed below the fifth transport position TP5, a pusher 37 is disposed below the sixth transport position TP6, and a pusher 38 is disposed below the seventh transport position TP7. Further, a pure water replacement section 160 including a tub and a pure water nozzle is disposed between the CARE unit 30C and the pusher 37, and a pure water replacement section 162 including a tub and a pure water nozzle is also disposed between the CARE unit 30D and the pusher 38.

As will be understood from the use of a slurry or the like in surface removal processing, the surface removal processing section 3 is the dirtiest area. In this embodiment, therefore, discharge of air is carried out around a removal processing site, such as a platen, so as to prevent particles in the surface removal processing section 3 from flying to the outside. Further, the internal pressure of the surface removal processing section 3 is made lower than the external pressure of the apparatus and the internal pressures of the neighboring cleaning section 4 and loading/unloading section 2, thereby preventing particles from flying out. A ventilation duct (not shown) and a filter (not shown) are usually provided respectively below and above a removal processing site, such as a platen, so as to create a downward flow of cleaned air through the ventilation duct and the filter.

The cleaning section 4, which is an area for cleaning a substrate, includes a second transport robot 40, a reversing machine 41 for reversing a substrate received from the second transport robot 40, three cleaning units 42, 43, 44 for cleaning the substrate, a drying unit 45 for rinsing the cleaned substrate with pure water and then spin-drying the substrate, and a movable third transport robot 46 for transporting the substrate between the reversing machine 41, the cleaning units 42, 43, 44 and the drying unit 45. The second transport robot 40, the reversing machine 41, the cleaning units 42 to 44 and the drying unit 45 are arranged in a line along the long direction of the apparatus, and the third transport robot 46 is movably disposed between the first linear transporter 5 and the line of the second transport robot 40, the reversing machine 41, the cleaning units 42 to 44 and the drying unit 45. A filter-fan unit (not shown) having a clean air filter is provided above the cleaning units 42 to 44 and the drying unit 45, and clean air, from which particles have been removed by the filter-fan unit, continually blows downward. The interior of the cleaning unit 4 is constantly kept at a higher pressure than the surface removal processing section 3 to prevent inflow of particles from the surface removal processing section 3.

In this embodiment, the first and second cleaning units 42, 43 are chemical cleaning units which cleans a substrate by immersing the substrate in a chemical solution, such as aqua regia, SPM (sulfuric acid-hydrogen peroxide mixture) or hydrofluoric acid, and the third cleaning unit 44 is a pure water cleaning unit which cleans a substrate by supplying pure water to the substrate. In particular, the first cleaning unit 42 uses hydrofluoric acid as a cleaning chemical and the second cleaning unit 43 uses aqua regia as a cleaning chemical.

As shown in FIG. 1, a shutter 10, located between the reversing machine 31 and the first transport robot 22, is provided in the partition wall 1a surrounding the surface removal processing section 3. The shutter 10 is opened when transferring a substrate between the first transport robot 22 and the reversing machine 31. Further, a shutter 13 located at a position facing the CMP unit 30B and a shutter 14 located at a position facing the CARE unit 30C are provided in the partition wall 1b surrounding the surface removal processing section 3.

Processing for flattening a surface of a substrate by the flattening apparatus having the above construction will now be described.

One substrate is taken by the first transport robot 22 out of a substrate cassette mounted in one of the front loading sections 20, and the substrate is transported to the reversing machine 31. The reversing machine 31 180° reverses the substrate and then places the substrate on the lifter 32 at the first transport position TP1. The top ring 301A of the lapping unit 30A receives the substrate from the lifter 32, and the lapping unit 30A carries out lapping of the surface of the substrate. In particular, in the lapping unit 30A, lapping of the substrate surface is carried out, e.g., at a processing rate of not more than several tens of μm/h while supplying a lapping liquid, such as a diamond slurry or a colloidal silica slurry, to the platen 301A, thereby removing the substrate surface in an amount corresponding to a thickness of about 10 μm and flattening the substrate surface. In this case, the depth of damage in the substrate surface after processing is about 1 μm. The substrate surface is then rinsed with pure water, as necessary.

The substrate after lapping is transferred to the pusher 33 at the second transport position TP2, and is then transported to the third transport position TP3 by horizontally movement of the first linear transporter 5. The top ring 301B of the CMP unit 30B receives the substrate from the pusher 34 at the third transport position TP3, and the CMP unit 30B carries out chemical mechanical polishing of the surface of the substrate. In particular, in the CMP unit 30B, chemical mechanical polishing of the substrate surface is carried out, e.g., at a processing rate of not more than several μm/h while supplying a polishing liquid, e.g., containing colloidal silica, to the polishing table 300B, thereby removing the substrate surface in an amount corresponding to a thickness of about several μm and further flattening the substrate surface. In this case, the depth of damage in the substrate surface after processing is about 10 nm. The substrate surface is then rinsed with pure water, as necessary.

The substrate after CMP is transferred to the lifter 35 at the fourth transport position TP4. The second transport robot 40 receives the substrate from the lifter 35 and transports the substrate to the reversing machine 41. The reversing machine 41 180° reverses the substrate and then transports it to the first cleaning unit (chemical cleaning unit) 42. The first cleaning unit 42 carries out hydrofluoric acid cleaning of the substrate by immersing the substrate in hydrofluoric acid, for example. The substrate after the hydrofluoric acid cleaning is transported by the third transport robot 46 to the third cleaning unit (pure water cleaning unit) 45, where the substrate is cleaned with pure water. Thereafter, the substrate is returned by the third transport robot 46 to the reversing machine 41. When chemical cleaning of the substrate is not necessary, the substrate, which has been 180° reversed by the reversing machine 41, is transported by the third transport robot 46 to the third cleaning unit (pure water cleaning unit) 45, where the substrate is cleaned with pure water, and the substrate is then returned by the third transport robot 46 to the reversing machine 41. The reversing machine 41 180° reverses the substrate.

The second transport robot 40 receives the reversed substrate from the reversing machine 41 and places the substrate on the lifter 36 at the fifth transport position TP5. The second linear transporter 6 moves horizontally to transport the substrate on the lifter 36 to one of the sixth transport position TP6 and the seventh transport position TP7. The substrate holder 130 of the CARE unit 30C or 30D receives the substrate from the pusher 37 or 38, and the CARE unit 30C or 30D carries out CARE (catalyst-referred etching) processing of the surface of the substrate. In particular, in the CARE unit 30C or 30D, CARE processing of the substrate surface, which utilizes the catalytic action on SiC by the surface platinum layer 142 of the catalyst platen 126, is carried out, e.g., at a processing rate of not more than 100 nm/h while supplying a processing solution, e.g., comprising hydrofluoric acid, to the catalyst platen 126, thereby removing the substrate surface in an amount corresponding to a thickness of about several tens of μm. In this case, the depth of damage in the substrate surface after processing is zero.

For the substrate which has undergone CARE processing in the CARE unit 30C, hydrofluoric acid remaining on the substrate surface after CARE processing is replaced with pure water in the pure water replacement section 160, and the substrate is then returned to the sixth transport position TP6. For the substrate which has undergone CARE processing in the CARE unit 30D, hydrofluoric acid remaining on the substrate surface after CARE processing is replaced with pure water in the pure water replacement section 162, and the substrate is then returned to the seventh transport position TP7. The substrate after pure water replacement is then moved by the second linear transporter 6 to the fifth transport position TP5. There is a case where the surface of the substrate after CARE processing can be roughened when the surface with hydrofluoric acid attached is exposed to light of an excitation wavelength. In such a case, it is desirable to attach a UV blocking film to windows facing the transport path from the CARE unit 30C to the pure water replacement section 160 and the transport path from the CARE unit 30D to the pure water replacement section 162.

The second transport robot 40 takes the substrate out of the fifth transport position TP5 and transports the substrate to the reversing machine 41. The reversing machine 41 180° reverses the substrate and then transports it to the first cleaning unit 42. The third transport robot 46 transports the substrate form the first cleaning unit 42 to the second cleaning unit 43, where the substrate is cleaned by immersing it in aqua regia. The aqua regia cleaning of the substrate is carried out a plurality of times, as necessary.

The third transport robot 46 transports the substrate after aqua regia cleaning to the third cleaning unit (pure water cleaning unit) 44, where the substrate is cleaned with pure water. The third transport robot 46 transports the substrate after pure water cleaning to the drying unit 45, where the substrate is rinsed with pure water and then rotated at a high speed to spin-dry the substrate. The first transport robot 22 receives the substrate after spin-drying from the drying unit 45 and returns the substrate to the substrate cassette mounted in the front loading section 20.

Methods for detecting the end point of CARE processing in the CARE units 30C, 30D include (a) a method of detecting the end point from the processing time, (b) a method of detecting the end point from a change in the electric current of a drive motor for rotationally driving a catalyst platen, (c) a method of detecting the end point from a change in the concentration of a processing solution, (d) a method of detecting the end point by measuring the processing surface with an in-situ optical monitor (e.g., photoluminescence method), (e) a method comprising taking a substrate out of a processing solution, and detecting the end point (either in situ or ex situ) by using a device such as a TEM, (g) a method of detecting the end point from a change in the weight of a substrate (workpiece) before and after processing, etc. The end point of CARE processing can also be detected by an SEM for a patterned substrate such as an SiC wafer. When the crystallinity of a processed surface is of importance, it is preferred to use the photoluminescence method which can determine the crystallinity. The photoluminescence method is easy to operate because it can be carried out at atmospheric pressure.

According to this embodiment, using the lapping unit 30A as a first surface removal processing unit, lapping of a substrate surface to enhance the flatness of the surface is first carried out, e.g., at a processing rate of not more than several tens of μm/h, thereby removing the substrate surface in an amount corresponding to a thickness of about 10 μm (the depth of damage in the substrate surface after processing is about 1 μm); using the CMP unit 30B as a second surface removal processing unit, CMP processing of the substrate surface to further enhance the flatness of the surface is carried out, e.g., at a processing rate of not more than several μm/h, thereby removing the substrate surface in an amount corresponding to a thickness of about several μm (the depth of damage in the substrate surface after processing is about 10 nm); and using the CARE unit 30C or 30D as a third (final) surface removal processing unit, CARE processing of the substrate surface to enhance the flatness of the surface is lastly carried out, e.g., at a processing rate of not more than 100 nm/h, thereby removing the substrate surface in an amount corresponding to a thickness of about several tens of nm (the depth of damage in the substrate surface after processing is zero).

This processing method thus makes it possible to process a substrate (workpiece) at a sufficient processing rate while gradually enhancing the flatness of the surface (surface to be processed) of the substrate and finally create a damage-free, very flat processed surface. Depending on the type of the workpiece, the state of the processed surface, etc., one of lapping (first surface removal processing) and CMP (second surface removal processing) may be omitted.

In the case of CARE processing of SiC, dissolved C (carbon) is present in a processing solution after processing and the carbon needs to be treated. A method for treating the carbon comprises irradiating the processing solution after use with UV light at a position opposite a substrate holder on a catalyst platen and/or in a circulation line to break the chemical bond, and allowing carbon to precipitate at a different place. The carbon concentration of the processing solution in a processing tank can thus be decreased. Further, it is preferred to provide a filter in a circulation line or piping for the processing solution so as to filter out carbon and other possible impurities that will adversely affect CARE processing.

When flatly processing a surface of a substrate, an SiC wafer, by CARE using hydrofluoric acid as a processing solution and platinum as a catalyst as in this embodiment, the processed surface of the substrate will be contaminated with platinum. The platinum contaminant can be removed by aqua regia cleaning carried out by immersing the substrate in aqua regia.

FIG. 7 shows the results of total reflection X-ray fluorescence (TRXF) analysis of platinum contamination as measured on an SiC wafer sample after CARE processing and on the processed sample after cleaning with aqua regia. The CARE processing was carried out by using hydrofluoric acid as a processing solution and platinum as a catalyst under the processing conditions shown in Table 1 below. The aqua regia cleaning was carried out by immersing the sample in a 3:1 mixed solution (aqua regia) of hydrochloric acid (60%) and nitric acid (60%) at 60° C. for 10 minutes, followed by rinsing of the sample with ultrapure water for one minute. The above cleaning operation was repeated a plurality of times. The TRXF measurement was carried out under the measurement conditions shown in Table 2 below.

TABLE 1

Sample: n-type 4H-SiC 2 inch wafer
Plane direction: 8° off Si plane
Resistivity: 0.01-0.05 Ωcm TABLE 1-continued Catalyst platen: 300 mm Pt platen
Processing time: 30 hrs

TABLE 2

Voltage applied: 40 kV
Electric current: 40 mA
Incidence angle of incident X-ray: 0.050 deg
Incidence time of incident X-ray: 100 sec As can be seen from FIG. 7, platinum contamination was observed on the sample after CARE processing; and the platinum contamination decreased with the repetition of the aqua regia cleaning of the sample.

For comparison, the same SiC wafer sample was CARE-processed in the same manner as described above, and the processed sample was subjected to SPM cleaning and further to hydrofluoric acid cleaning. The SPM cleaning was carried out by immersing the sample in a 4:1 mixed solution of sulfuric acid (98%) and hydrogen peroxide water (30%) for 10 minutes, followed by rinsing of the sample with ultrapure water for one minute. The hydrofluoric acid cleaning was carried out by immersing the sample in hydrofluoric acid (50% HF) for 10 minutes, followed by rinsing of the sample with ultrapure water for one minute. FIG. 8 shows the results of TRXF analysis of platinum contamination on the sample after CARE processing, on the processed sample after SPA cleaning and on the processed sample after the additional HF cleaning. As can be seen from FIG. 8, the platinum contaminant on the sample after CARE processing cannot be removed by SPM cleaning nor by hydrofluoric acid cleaning.

In this embodiment, the surface of SiC is processed (etched) by CARE using hydrochloric acid as a processing solution and platinum as a surface catalyst of a catalyst platen. It is also possible to process (etch) a surface of Si, SiC, GaN, sapphire, ruby or diamond by CARE using hydrohalic acid, such as hydrofluoric acid or hydrochloric acid, as a processing solution and platinum, gold, a ceramic solid catalyst, molybdenum or a molybdenum alloy as a catalyst.

Further, it is possible to process (etch) a surface of Si, SiC, GaN, sapphire, ruby or diamond by CARE using hydrogen peroxide water or ozone water as a processing solution and a transition element, such as Fe, Ni, Co, Cu, Cr or Ti, as a surface catalyst of a catalyst platen.

For example, in the CARE units 30C, 30D shown in FIGS. 2 through 4, it is possible to process (etch) a surface of a substrate, such as an SiC wafer, by supplying hydrogen peroxide water as a processing solution from the processing solution supply nozzle 174 to a catalyst paten 126 wholly made of iron which itself has a catalytic action. When processing a surface of a substrate, such as an SiC wafer, by CARE using hydrogen peroxide water as a processing solution and iron as a catalyst, the processed surface of the substrate will be contaminated with iron and an oxide film will be formed in the processed surface of the substrate.

Figure 9B:
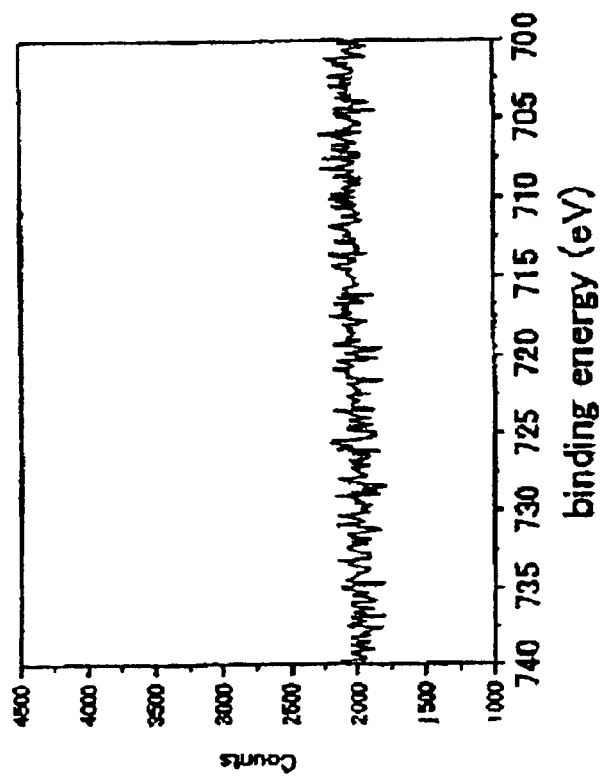
FIGS. 9A and 9B are graphs showing the results of X-ray photoelectron spectroscopy of iron contamination as measured on a sample after CARE processing and on the processed sample after cleaning with SPM.
Figure 9A:
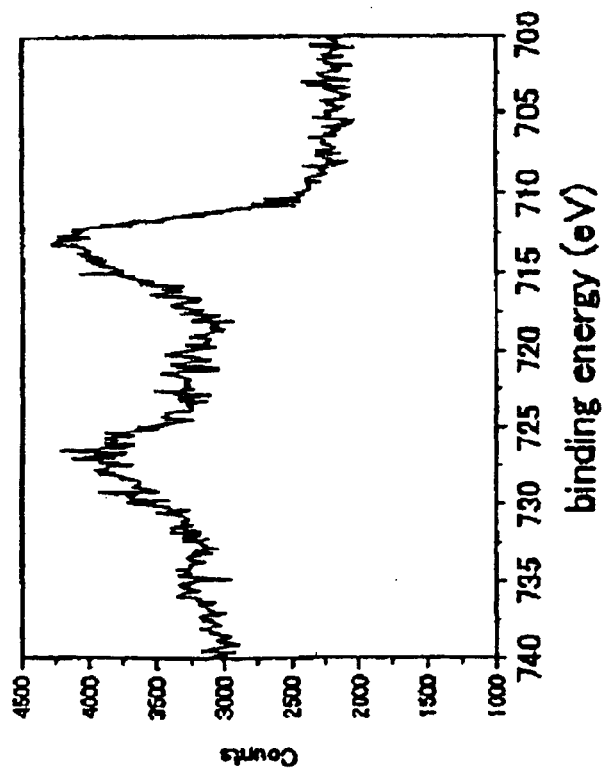

FIGS. 9A and 9B show the results of X-ray photoelectron spectroscopy (XPS) of iron contamination as measured on an SiC wafer sample after CARE processing and on the processed sample after cleaning with SPM, FIG. 9A showing the XPS data at the Fe2p core level for the sample after CARE processing and FIG. 9B showing the XPS data at the Fe2p core level for the sample after SMP cleaning. The CARE processing was carried out by using hydrogen peroxide water as a processing solution and iron as a catalyst under otherwise the same processing conditions as indicated in Table 1 above, and the SPM cleaning was carried out in the same manner as described above with reference to the TRXF analysis of platinum contamination. As clearly shown in FIG. 9A, a signal at the Fe2p core level was detected for the sample after CARE processing, whereas no signal at the Fe2p core level was detected for the sample after SPM cleaning as will be appreciated from FIG. 9B. This indicates that the iron contaminant on the sample after CARE processing was completely removed by the SPM cleaning.

The surface removal process for SiC generally passes through the stage of oxidation of the surface and the stage of removal of the oxide film. Accordingly, an oxide film may remain on a surface of a workpiece after processing. Especially in a light irradiation CARE process in which processing of a workpiece is carried out while irradiating the surface to be processed of the workpiece with ultraviolet light, due to promoted oxidation of the surface to be processed by the UV irradiation, an oxide film is likely to remain on the processed surface.

Figure 10:
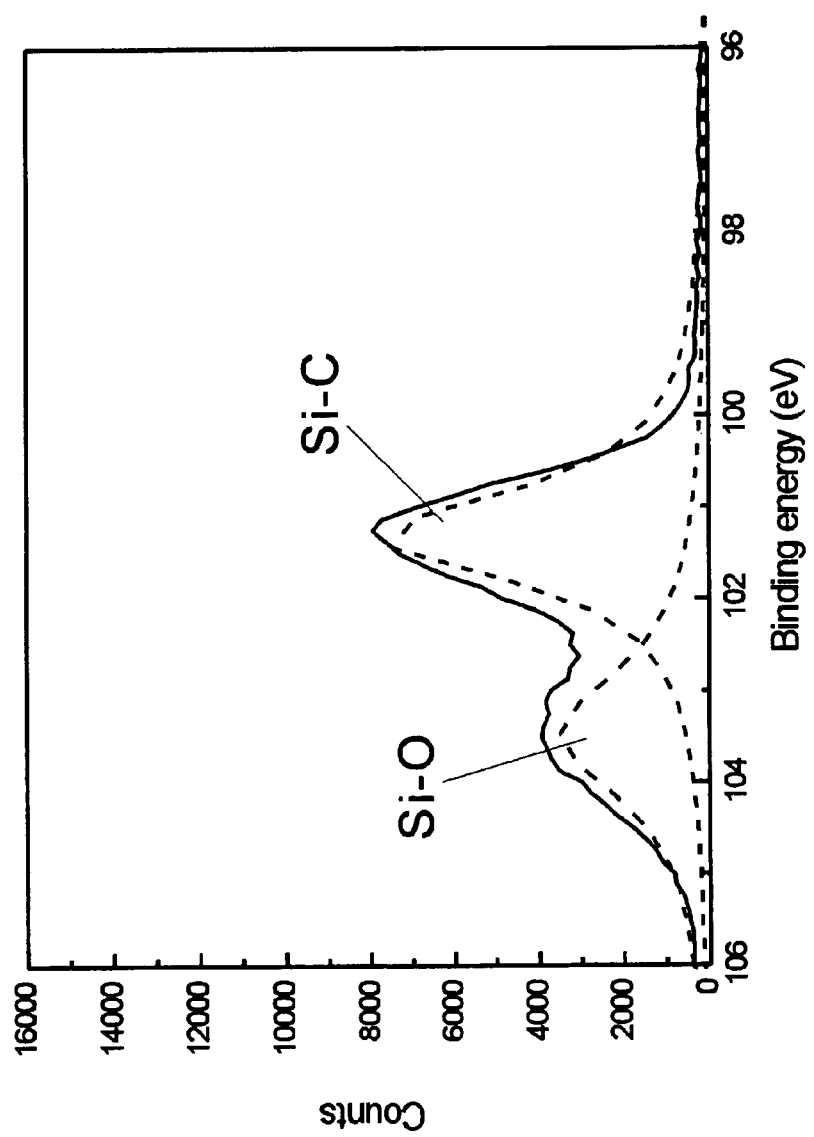
FIG. 10 is a graph showing the results of X-ray photoelectron spectroscopy of a surface of an SiC sample after light irradiation CARE processing.
Figure 11:
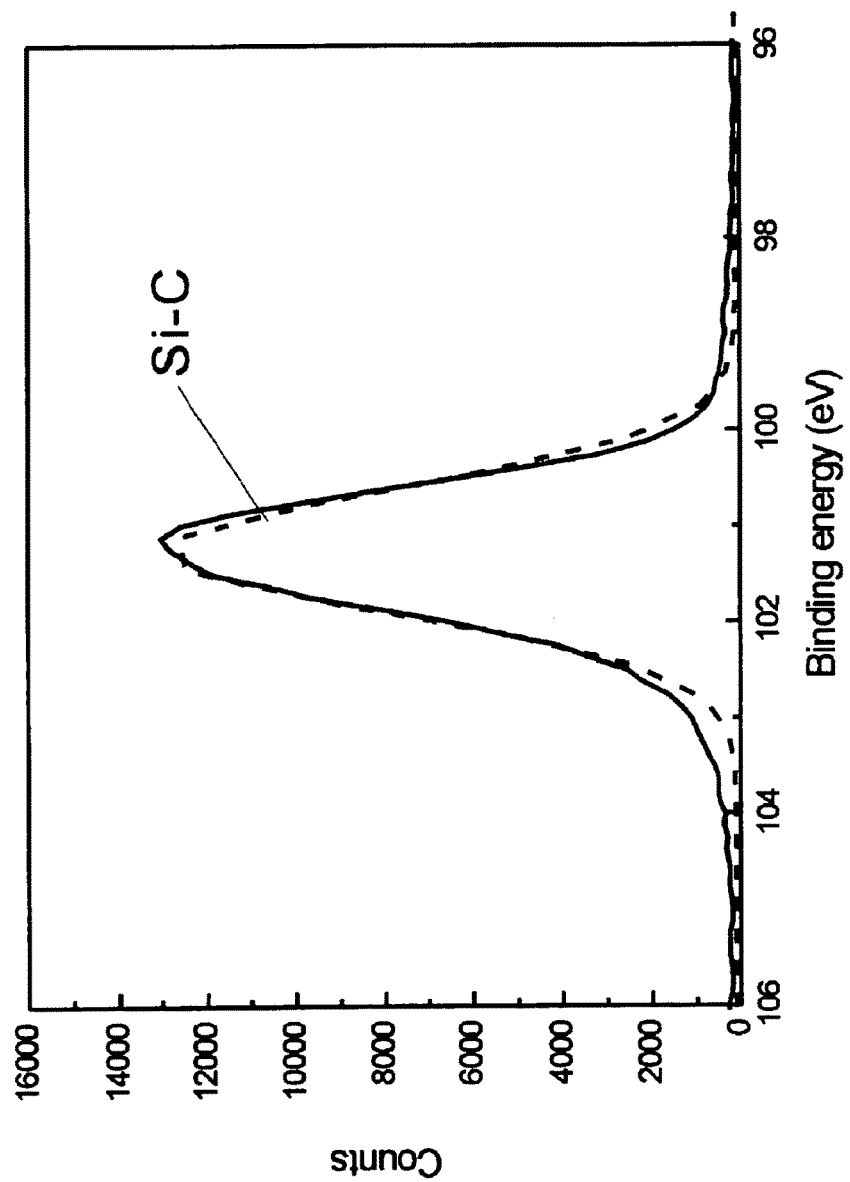
FIG. 11 is a graph showing the results of X-ray photoelectron spectroscopy of the surface of the processed SiC sample of FIG. 10 as measured after cleaning the sample with hydrofluoric acid.

FIG. 10 shows the results of X-ray photoelectron spectroscopy of a surface of an SiC sample after light irradiation CARE processing, and FIG. 11 shows the results of X-ray photoelectron spectroscopy of the surface of the processed SiC sample as measured after cleaning the sample with hydrofluoric acid. The light irradiation CARE processing was carried out for 6 hours by using hydrogen peroxide water as a processing solution and quartz glass as a catalyst and irradiating the surface to be processed of the sample with ultraviolet light during processing. The hydrofluoric acid cleaning was carried out by immersing the sample after the light irradiation CARE processing in 50% hydrofluoric acid solution for 10 minutes. FIG. 10 shows the peak at 103.6 eV, indicating the presence of $SiO_2$ oxide film, in addition to the peak (101.3 eV) indicating the Si—C bond of the sample material. On the other hand, FIG. 11 shows no peak concerning $SiO_2$ and a larger peak value concerning Si—C bond. The comparative data clearly demonstrates the fact that the hydrofluoric acid cleaning can fully remove the oxide film remaining on the surface of the SiC sample after light irradiation CARE processing.

Also in the case of CARE processing of an SiC workpiece as carried out by using hydrogen peroxide water as a processing solution and iron as a catalyst, it is considered, in view of the removal processing principle, that an oxide film will remain on the surface of the workpiece after processing. Thus, also in this case, it is preferred to carry out hydrofluoric acid cleaning of the workpiece after removal processing.

As will be appreciated from the above, when using hydrogen peroxide water as the processing solution supplied from the processing solution supply nozzle 174 and a catalyst platen wholly made of iron having a catalytic activity as the catalyst platen 126 in the CARE units 30C, 30D shown in FIGS. 2 through 4, it is preferred to use a hydrofluoric acid cleaning unit, which cleans a substrate by immersing it in hydrofluoric acid, as the first cleaning unit 142 of the flattening apparatus shown in FIG. 1 as in the above-described embodiment, and to use an SPM cleaning unit, which cleans a substrate by immersing it in SPM, as the second cleaning unit 43. By subjecting a substrate after CARE processing to hydrofluoric acid cleaning in the first cleaning unit 42 and then to SPM cleaning in the second cleaning unit 43, an iron contaminant on the surface of the substrate and an oxide film formed in the substrate surface can be removed.

When hydrogen peroxide water or ozone water is used as a processing solution, it is possible to use as a surface catalyst of a catalyst platen, beside the above-described transition metals, a noble metal such as platinum or gold, a ceramic metal oxide or a glass-type metal oxide. The ceramic metal oxide is exemplified by alumina, and the glass-type metal oxide is exemplified by sapphire ($Al_2O_3$), quartz ($SiO_2$) and zirconia ($ZrO_2$).

Further, when hydrogen peroxide water or ozone water is used as a processing solution, it is also possible to use an acidic or basic solid catalyst as a surface catalyst of a catalyst platen. The acidic or basic solid catalyst is exemplified by a non-woven fabric, a resin or a metal having an ion exchange function. Preferable examples of such materials having an ion exchange function include a non-woven fabric composed of polyethylene fibers, resins such as fluororesin and PEEK, and oxidation-resistant metals such as Pt and Au. For example, an ion exchange function can be imparted to a non-woven fabric of polyethylene fibers by graft polymerization. In this case, the etching rate of a workpiece can be increased by increasing the ion exchange capacity of a solid catalyst. Examples of other usable solid acid catalysts include a solid acid comprising silica-alumina with $H_2SO_4$, $H_3PO_4$, or the like adsorbed on it, inorganic salts such as a metal sulfate and a metal phosphate, and oxides such as $Al_2O_3$, $ThO_2$, $Al_2O_3$—$SiO_2$ and $TiO_2$—$SiO_2$. Examples of solid base catalysts include a solid base comprising silica gel with NaOH, KOH, Na, K or the like adsorbed on it, inorganic salts such as $Na_2CO_3$, $Ba_2CO_3$ and $Na_2WO_4$, and oxides such as CaO, MgO, SrO, MgO—$SiO_2$ and MgO—$Al_2O_3$.

Contamination (especially organic contamination) of a surface of a platen or the presence of an oxide film in the surface of the platen will affect wettability of the platen surface. In order to improve wettability of a surface of a catalyst platen, the following treatments of the catalyst platen can be carried out before or during processing:

(1) Treatment to improve wettability of catalyst platen carried out before processing:

A catalyst platen before processing is subjected to chemical cleaning (e.g., with SPM) or ultraviolet irradiation. The chemical cleaning can remove an organic contaminant from the platen surface, thereby improving wettability of the platen surface. The ultraviolet irradiation will oxidize the surface of the platen, when it is made of, e.g., iron, thereby improving wettability of the surface. The ultraviolet irradiation treatment is applicable to catalyst platens other than a platinum platen.

(2) Treatment to improve wettability of catalyst platen carried out during processing:

Ultraviolet light is applied to a surface portion, which is different from the portion facing a top ring, of a catalyst platen during processing to form an oxide film in the platen surface, thereby improving wettability of the platen surface. Owing to the improved wetting of the paten surface with a plating solution, organic matter which adheres to the platen surface during processing will be removed. This further enhances wettability of the platen surface and makes the surface more hydrophilic. If a surface oxide film of, e.g., an iron platen is removed during processing, the ultraviolet irradiation can form a surface oxide film again to improve wettability of the platen surface.

In the above-described embodiments, CARE processing in the CARE unit 30C or 30D is carried out in a piece-by-piece manner by pressing one substrate, held by the substrate holder 130, against the catalyst platen in each operating cycle. A catalyst platen is generally costly. Further, the surface conditions of a catalyst platen affect the processing performance. Accordingly, and also with a view to increasing the throughput, it is preferred to simultaneously process a plurality of substrates, e.g., four substrates, by simultaneously pressing the plurality of substrates, held by one substrate holder, against a catalyst platen. It is also possible to use a CARE unit which includes a plurality of substrate holders which each hold one substrate.

Prior to CARE processing, a substrate (workpiece) is preferably subjected to wet cleaning to clean a surface (surface to be processed). A surface of a substrate may be contaminated with particles, an organic substance and/or a metal. Non-scrub cleaning, such as water jet cleaning (hydrofluoric acid cleaning when using colloidal silica), is suited for particle contamination, SPM (sulfuric acid-hydrogen peroxide mixture) cleaning is suited for organic contamination, and SPM cleaning or hydrofluoric acid cleaning is suited for metal contamination. A surface of an SiC substrate per se does not change by such cleaning, and only a contaminant can be removed.

Figure 12A:
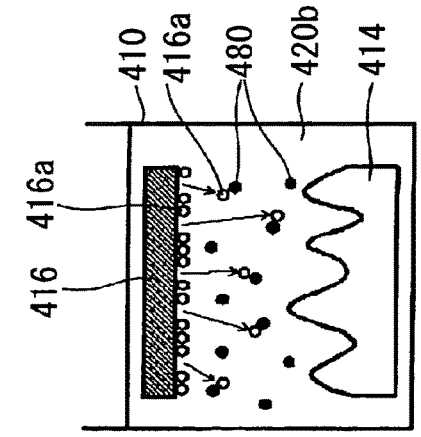
FIGS. 12A through 12D are diagrams illustrating the concept of CARE processing of a workpiece with the use of a processing solution containing a buffer solution (buffering agent)
Figure 12B:
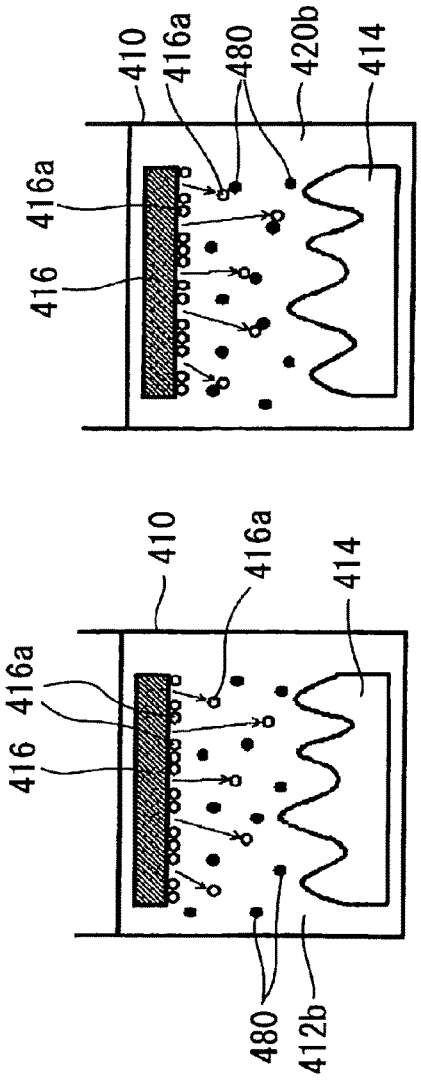
Figure 12C:
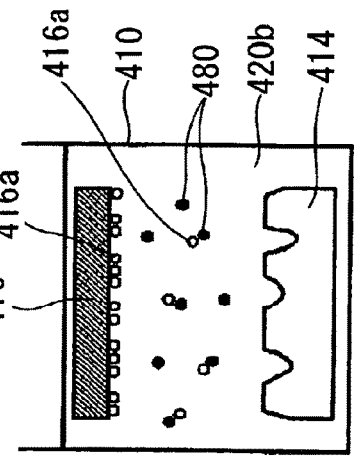
Figure 12D:
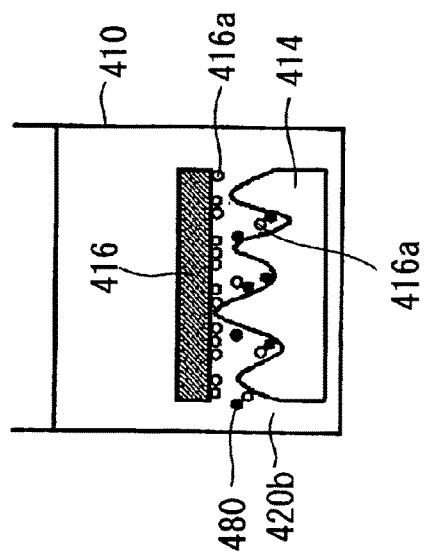

FIGS. 12A through 12D illustrate the concept of CARE processing of a workpiece with the use of a processing solution containing a buffer solution (buffering agent). As shown in FIG. 12A, when an acidic solid catalyst 416 is immersed in a processing solution 412b, hydrogen ions ($H^+$) 416a are generated at a surface of the acidic solid catalyst 416, and the hydrogen ions 416a leave the surface of the acidic solid catalyst 416. The processing solution 412b contains a buffering agent 480 dissolved therein, and the hydrogen ions 416a, which have left the surface of the acidic solid catalyst 416, promptly react with the buffering agent 480 and become inactive, as shown in FIG. 12B. Thus, the hydrogen ions 416a are present only on or in the close vicinity of the surface, serving as a processing reference surface, of the acidic solid catalyst 416. When the acidic solid catalyst 416 is brought into contact with or close proximity to the surface to be processed of a workpiece 414 in the processing solution containing the buffering agent 480, as shown in FIG. 12C, surface atoms of the workpiece 414 at the contact portion are dissolved by chemical reaction in the processing solution 412b. When the acidic solid catalyst 416 is separated from the surface to be processed of the workpiece 414, as shown in FIG. 12D, the hydrogen ions 416a generated at the surface of the acidic solid catalyst 416 do not act on the surface of the workpiece 414 any more whereby the dissolution reaction stops. Thus, the surface to be processed of the workpiece 414 is processed only when the acidic solid catalyst 416 is in contact with or in close proximity to the surface to be processed.

Examples of solid acid catalysts include a solid acid comprising silica-alumina with $H_2SO_4$, $H_3PO_4$, or the like adsorbed on it, inorganic salts such as a metal sulfate and a metal phosphate, and oxides such as $Al_2O_3$, $ThO_2$, $Al_2O_3$—$SiO_2$ and $TiO_2$—$SiO_2$. Examples of solid base catalysts include a solid base comprising silica gel with NaOH, KOH, Na, K or the like adsorbed on it, inorganic salts such as $Na_2CO_3$, $Ba_2CO_3$ and $Na_2WO_4$, and oxides such as CaO, MgO, SrO, MgO—$SiO_2$ and MgO—$Al_2O_3$.

When a processing solution does not contain a buffer solution (buffering agent), i.e., when a buffering agent is not present in the processing solution, hydrogen ions diffuse in the processing solution even after they leave a surface of an acidic solid catalyst. Hydrogen ions can therefore be present also in those places which lie at a distance from the surface of the acidic solid catalyst. Accordingly, when the acidic solid catalyst is brought into contact with or close proximity to the surface to be processed of a workpiece in the processing solution, surface atoms of the surface to be processed, not only those lying in the vicinity of the surface of the acidic solid catalyst but also those lying at a distance therefrom, will be dissolved by chemical reaction in the processing solution. Thus, hydrogen ions act not only on raised portions of the surface to be processed but on recessed portions as well, whereby the surface to be processed will be processed isotropically and flattening of the surface will not progress.

A phosphate buffer solution is an exemplary buffer solution (buffering agent). Other buffer solutions, such as an acetate buffer solution and a citrate buffer solution, may also be used insofar as it reduces a change in the pH of the processing solution. When a buffer solution is used as an additive in a processing solution, the processing solution preferably is ultrapure water or an aqueous solution containing an oxidizing agent, such as ozone water, hydrogen peroxide water or an aqueous potassium persulfate solution. The concentration of buffering agent in a processing solution is preferably such as to adjust the pH of the processing solution to a predetermined value. When processing a GaN substrate, for example, the pH of a processing solution is preferably adjusted to around 7 (6.5 to 7.5).

Figure 13:
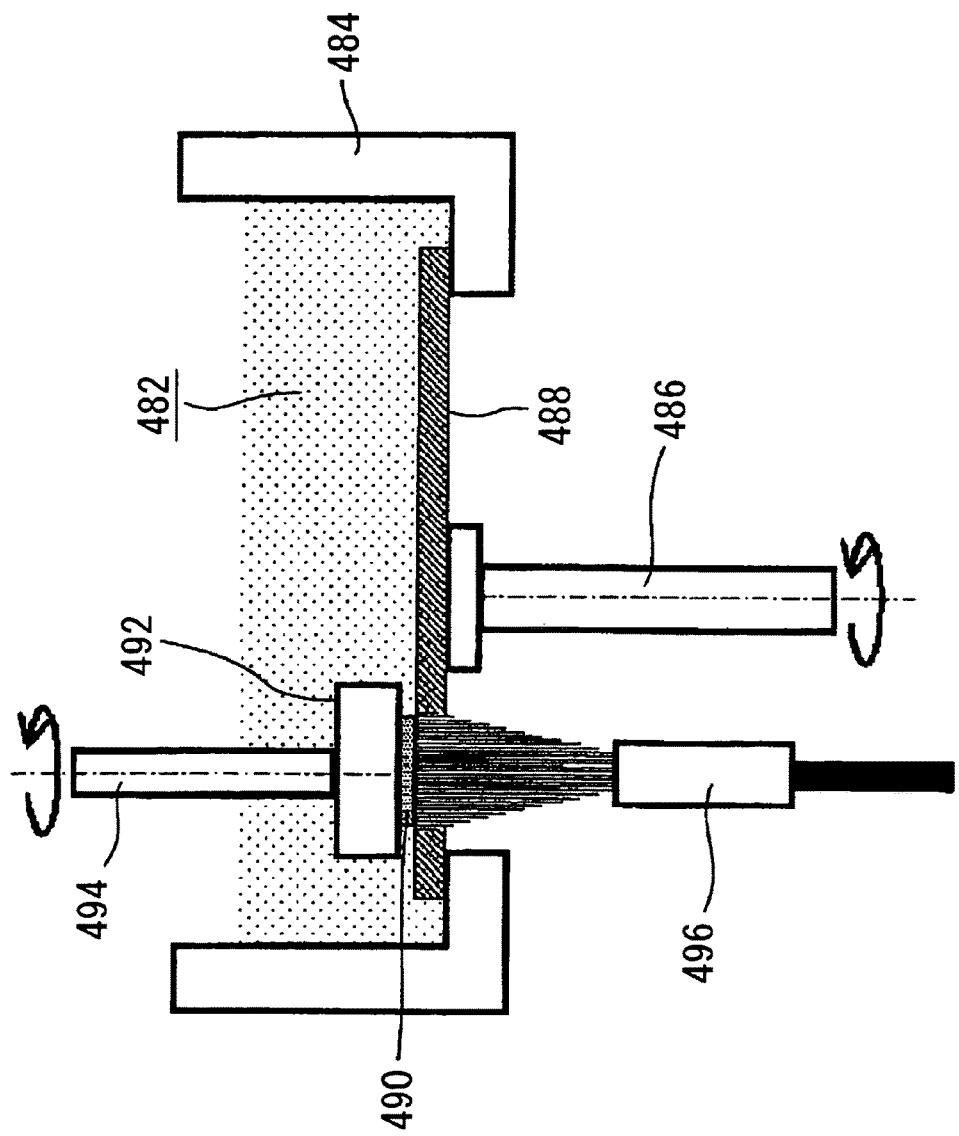
FIG. 13 is a diagram schematically showing a CARE unit (light irradiation CARE unit) provided with a light source.

FIG. 13 schematically shows a CARE unit (light irradiation CARE unit) provided with a light source. The CARE unit (light irradiation CARE unit) includes a vessel 484 for filling it with a processing solution 482, e.g., containing a buffer solution (buffering agent), a platen 488 coupled to the upper end of a rotating shaft 486 and rotatably disposed in the vessel 484, and a holder 492 for detachably holding a workpiece 490, such as a GaN substrate, with its surface to be processed facing downwardly. The holder 492 is secured to the lower end of a rotating shaft 494. A light source 496 is provided below the platen 488. The platen 488 is comprised of an acidic solid catalyst having high light transmissivity, such as quartz, so that light, e.g., ultraviolet light, from the light source 496 passes through the platen 488 and applied to the lower surface (surface to be processed) of the workpiece 490. The platen 488 may also be comprised of sapphire, zirconia, or the like, having high light transmissivity.

Figure 14A:
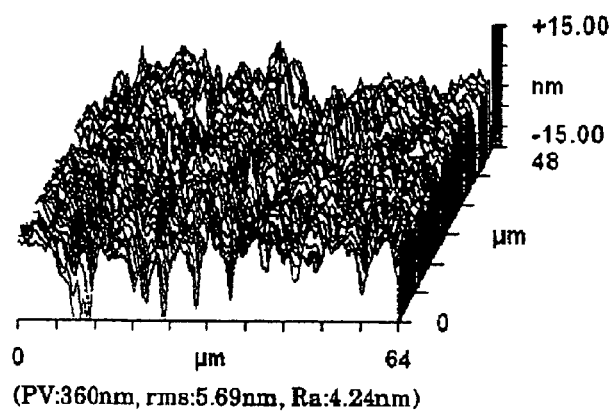
FIG. 14A shows a phase-shifting interference microscopic image of a surface of a sample (GaN wafer) before CARE processing.
Figure 14B:
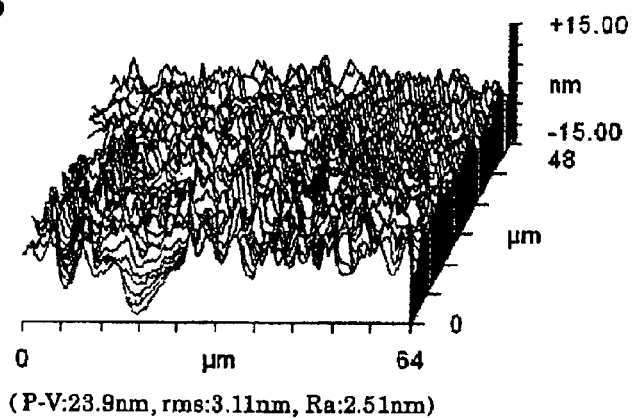
FIG. 14B shows a phase-shifting interference microscopic image of the surface of the sample after carrying out CARE processing using a processing liquid (ultrapure water) not containing a buffer solution (buffering agent)
Figure 14C:
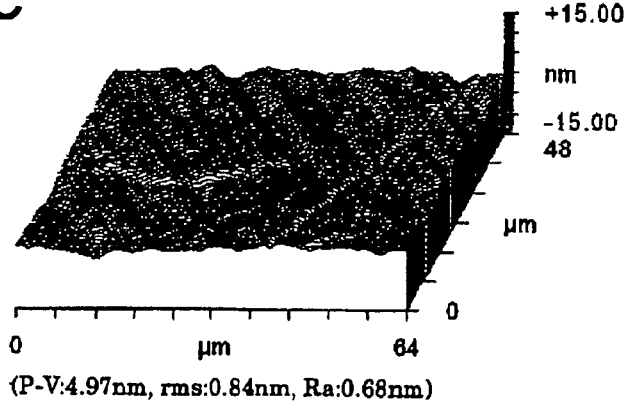
FIG. 14C shows a phase-shifting interference microscopic image of the surface of the sample after carrying out CARE processing using a processing solution containing a buffer solution (buffering agent)

Using the CARE unit (light irradiation CARE unit) shown in FIG. 13, processing of a GaN wafer (sample) was carried out for 3 hours under ultraviolet irradiation. FIG. 14A shows a phase-shifting interference microscopic image of the surface of the sample before processing, FIG. 14B shows a phase-shifting interference microscopic image of the surface of the sample after carrying out processing using a processing liquid (ultrapure water) not containing a buffer solution (buffering agent), and FIG. 14C shows a phase-shifting interference microscopic image of the surface of the sample after carrying out processing using a processing solution (pure water) containing a buffer solution (phosphate buffer solution at a pH of 6.8).

FIG. 14A shows surface roughness as observed on the surface of the sample before processing. As will be appreciated from comparison between FIG. 14B and FIG. 14C, the processing of the sample carried out using the processing solution containing the buffer solution (buffering agent) reduced the surface roughness to a much larger extent as compared to the processing carried out using the processing liquid containing no buffer solution (buffering agent).

When a substrate, such as a semiconductor wafer, is irradiated with light having a larger energy than the band gap of the substrate material, electrons in the valence band are excited and electron-hole pairs are generated. Oxidation of the substrate surface occurs through the holes of the valence band generated by the light irradiation. When the electron-hole pairs generated by light adsorption recombine and disappear, an oxidation reaction will not occur at the substrate surface. The recombination should therefore be prevented in order to progress the surface oxidation. In this regard, when platinum (Pt) is allowed to be in electrical contact with the substrate, electrons in the conducting band are accumulated in the platinum, and electron exchange will take place between the platinum and a solution. This can prevent recombination of the electron-hole pairs generated.

An experiment on photooxidation of a surface of a GaN substrate was conducted to confirm the effect of electrical contact of platinum with the substrate. A 500-nm thick platinum film was formed by electron beam deposition on the back (000-1) surface of an n-type GaN (0001) substrate, thereby preparing a test sample in which the substrate is in electrical contact with the platinum layer. The same GaN substrate but with no platinum film formed on the back surface was used as a comparative sample.

Figure 15:
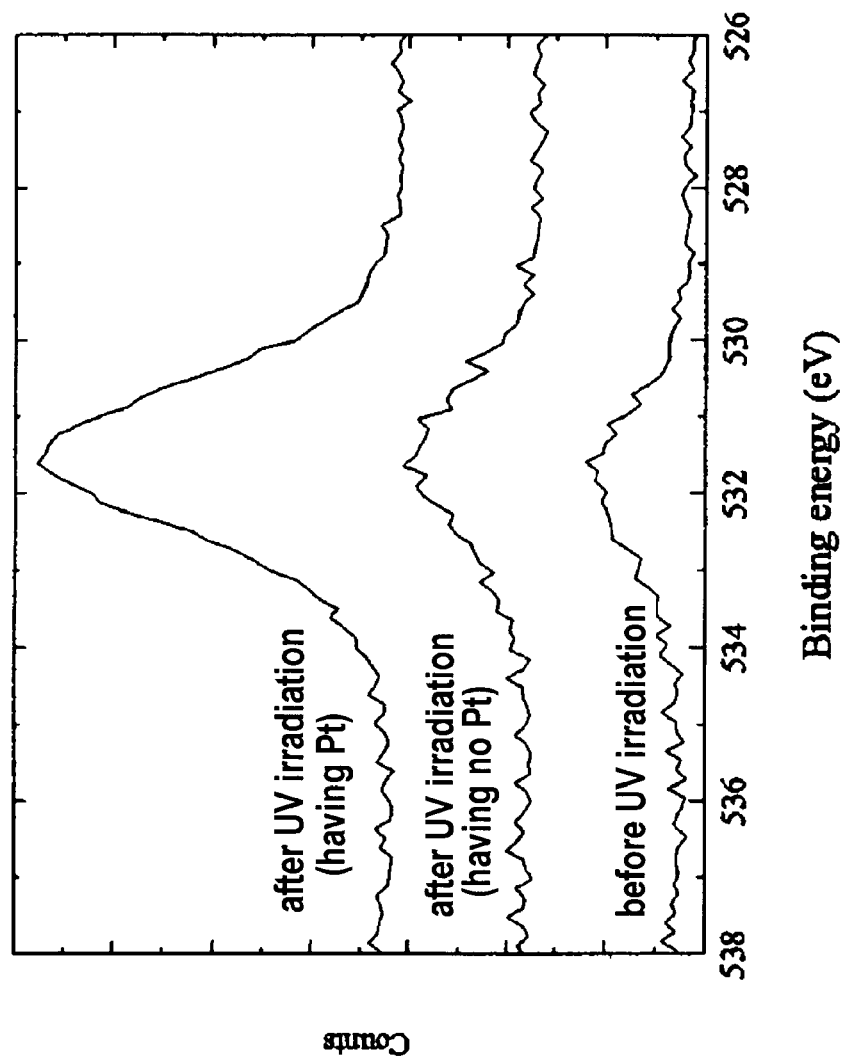
FIG. 15 shows XPC O1s spectra for a GaN substrate having a vapor-deposited platinum film on a back surface and for a GaN substrate having no platinum film on a back surface, as measured before and after carrying out light irradiation of the substrates while immersing the substrates in ultrapure water.

Light (UV light) irradiation was carried out for 3 hours on the respective substrate which was kept immersed in ultrapure water. FIG. 15 shows XPC O1s spectra for the GaN substrate sample and the comparative sample, as measured before and after the light irradiation. It is apparent from the data in FIG. 15 that for the comparative sample having no platinum film, there is no change in the O1s peak intensity before and after the light irradiation, whereas the O1s peak intensity of the sample having the platinum film is larger after the light irradiation. The data thus demonstrates that surface photooxidation occurs only in the GaN substrate having the platinum film on the back surface.

Figure 16A:
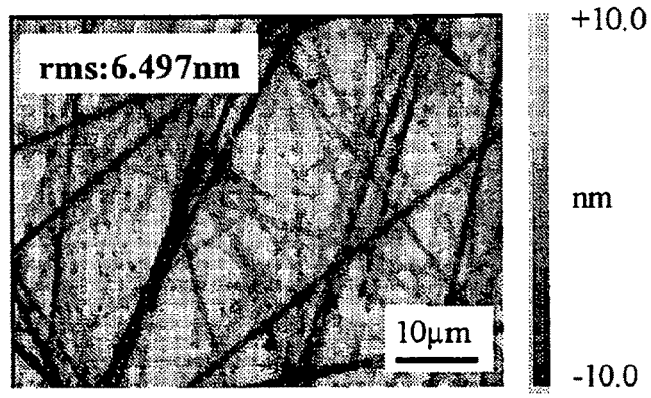
FIG. 16A shows a phase-shifting interference microscopic image of a surface of a sample (GaN substrate), having no vapor-deposited platinum film on a back surface, before light irradiation CARE processing.
Figure 16B:
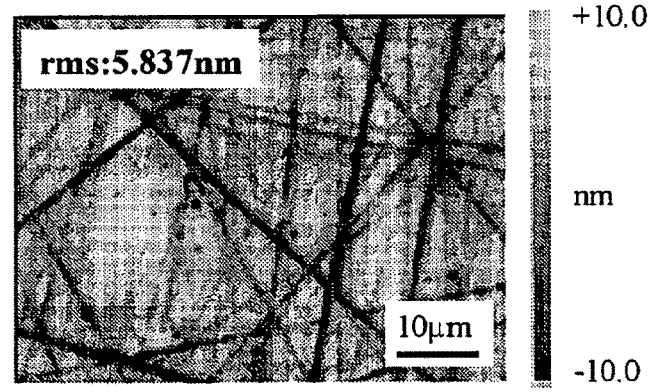
FIG. 16B shows a phase-shifting interference microscopic image of the surface of the sample (GaN substrate) of FIG. 16A after light irradiation CARE processing.
Figure 16C:
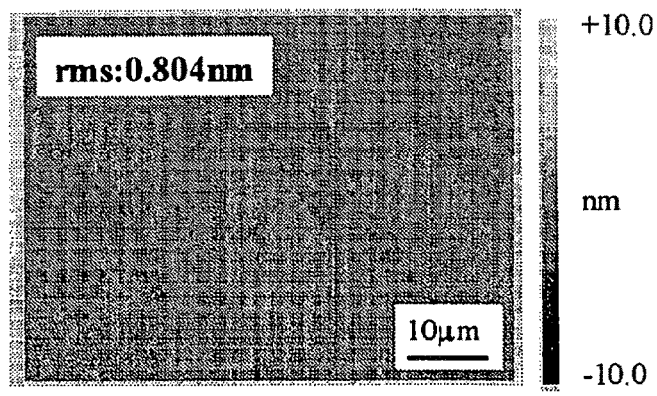
FIG. 16C shows a phase-shifting interference microscopic image of a surface of a sample (GaN substrate), having a vapor-deposited platinum film on a back surface, after light irradiation CARE processing.

A light irradiation CARE processing experiment was conducted using, as a sample, a GaN substrate having a vapor-deposited platinum film on the back surface and using, as a comparative sample, a GaN substrate with no platinum film formed on the back surface. Processing was carried out for 3 hours by immersing the respective substrate in phosphate buffer solution at a pH of 6.86 while irradiating the substrate surface with ultraviolet light. FIG. 16A shows a phase-shifting interference microscopic image of the surface of the comparative sample (GaN substrate), having no vapor-deposited platinum film on the back surface, before the light irradiation CARE processing, FIG. 16B shows a phase-shifting interference microscopic image of the surface of the comparative sample after the light irradiation CARE processing, and FIG. 16C shows a phase-shifting interference microscopic image of the surface of the sample (GaN substrate), having the vapor-deposited platinum film on the back surface, after the light irradiation CARE processing. As can be seen from comparison between FIGS. 16A and 16B, there is no significant change in the morphology and the micro roughness of the surface of the comparative sample, having no platinum film, before and after the processing, indicating no significant progress of processing. In contrast, as can be seen from comparison between FIG. 16A and FIG. 16C, scratches present in the substrate surface before processing are not found in the surface of the sample, having the platinum film, after the processing, and the micro roughness value 6.497 nm rms before processing decreased to 0.804 nm rms after processing. The comparative data thus demonstrates significant flattening by the CARE processing of the surface of the sample having the platinum film.

Besides platinum, it is possible to use other metals, such as Ti, Ni, Cr, etc. as a metal for contact with a substrate, though the use of platinum is preferred in the interface between a processing solution and a metal. A metal (platinum) film may be formed on a substrate by any known vapor deposition method, such as vacuum deposition, electron beam evaporation, sputtering, etc. While platinum is preferably vapor-deposited on substantially an entire back surface of a substrate, it is possible to vapor-deposit platinum on part of the back surface. Further, it is not always necessary to form a metal (platinum) film on a back surface of a substrate. Thus, any method that can ensure electrical contact between a substrate and a metal, such as the use of a substrate holder made of a metal, may be used. It is also possible to apply a platinum coating to an inner side of a retainer of a substrate holder so that the coating will contact the edge of a substrate.

While the present invention has been described with reference to the embodiments thereof, it will be understood by those skilled in the art that the present invention is not limited to the particular embodiments described above, but it is intended to cover modifications within the inventive concept.

What is claimed is:

1. An apparatus for flattening a surface of a substrate, comprising:
    a first surface removal processing unit configured to remove the surface of the substrate;
    a second surface removal processing unit configured to flatten the surface of the substrate, the second surface removal processing unit being a catalyst-referred etching (CARE) unit;
    a first cleaning unit configured to clean the substrate that has been processed by the first surface removal processing unit without cleaning the substrate that has been processed by the second surface removal processing unit;
    a second cleaning unit configured to clean the substrate that has been processed by the second surface removal processing unit without cleaning the substrate that has been processed by the first surface removal processing unit;
    a drying unit configured to dry the substrate cleaned by the first cleaning unit or the second cleaning unit; and
    a transport robot configured to transport the substrate processed by the first surface removal processing unit to the first cleaning unit and to transport the substrate processed by the second surface removal processing unit to the second cleaning unit;
    wherein the first surface removal processing unit comprises a chemical-mechanical polishing (CMP) unit, the CMP unit including:
        (i) a platen having a lapping surface;
        (ii) a top ring configured to hold the substrate and press the substrate against the platen to lap the substrate; and
        (iii) a lapping liquid supply nozzle configured to supply slurry onto the platen;
    wherein the catalyst-referred etching (CARE) unit includes:
        (a) a catalyst platen having a catalyst in a surface, the catalyst selected from a group consisting of platinum, gold, a ceramic solid catalyst, a transition metal, glass, and an acidic or basic solid catalyst;
        (b) a substrate holder configured to hold the substrate and to bring the surface of the substrate to be processed into contact with or close proximity to the surface of the catalyst platen;
        (c) a processing solution supply section configured to supply a processing solution between the catalyst platen and the substrate;
        (d) a drive section including a rotating shaft coupled to at least one of the catalyst platen and the substrate holder for moving the catalyst platen and the substrate holder relative to each other; and
        (e) a pure water replacement section including a pure water nozzle arranged to supply pure water to the substrate to replace the processing solution on the substrate with the pure water, the pure water replacement section being located outside the catalyst platen and located on a path of the substrate between the catalyst platen and the second cleaning unit.

2. The apparatus according to claim 1, wherein a plurality of through-holes are formed in the catalyst platen.

3. The flattening apparatus according to claim 1, wherein a plurality of concentric grooves are formed in the surface of the catalyst platen.

4. The flattening apparatus according to claim 1, wherein the substrate holder has a retainer ring made of the same material as the surface of the catalyst platen, the retainer ring being configured to prevent escape of the substrate.

5. The flattening apparatus according to claim 1, further comprising a conditioning section for carrying out conditioning of the surface of the catalyst platen.

6. The flattening apparatus according to claim 1, wherein the first cleaning unit comprises a hydrofluoric acid cleaning unit.

7. The flattening apparatus according to claim 1, wherein the second cleaning unit comprises a sulfuric acid-hydrogen peroxide mixture (SPM) cleaning unit.

8. The flattening apparatus according to claim 1, wherein the second cleaning unit comprises an aqua regia cleaning unit.

* * * * *